(12) United States Patent
Motoyoshi

(10) Patent No.: US 7,321,508 B2
(45) Date of Patent: *Jan. 22, 2008

(54) MAGNETIC MEMORY DEVICE AND METHOD FOR PRODUCTION THEREOF

(75) Inventor: Makoto Motoyoshi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/495,090

(22) Filed: Jul. 28, 2006

(65) Prior Publication Data

US 2006/0262597 A1    Nov. 23, 2006

Related U.S. Application Data

(63) Continuation of application No. 11/007,381, filed on Dec. 8, 2004, now Pat. No. 7,095,650.

(30) Foreign Application Priority Data

Dec. 15, 2003    (JP) .............................. 2003-416601

(51) Int. Cl.
    *G11C 11/14*  (2006.01)
(52) U.S. Cl. ...................... 365/171; 365/173
(58) Field of Classification Search ............... 365/171, 365/173, 158; 257/295, 421
    See application file for complete search history.

(56) References Cited

U.S. PATENT DOCUMENTS

| | | | |
|---|---|---|---|
| 5,940,319 A | 8/1999 | Durlam et al. | |
| 5,946,227 A * | 8/1999 | Naji | 365/158 |
| 6,498,747 B1 * | 12/2002 | Gogl et al. | 365/158 |
| 6,560,135 B2 | 5/2003 | Matsuoka et al. | |
| 6,643,168 B2 | 11/2003 | Okazawa | |
| 6,653,703 B2 | 11/2003 | Hosotani et al. | |
| 6,717,845 B2 | 4/2004 | Saito et al. | |
| 6,831,855 B2 | 12/2004 | Kishi et al. | |
| 6,834,008 B2 * | 12/2004 | Rinerson et al. | 365/158 |
| 6,909,129 B2 | 6/2005 | Kim et al. | |

OTHER PUBLICATIONS

J.M. Daughton, Magnetoresistive Memory Technology, Thin Solid Films 1992 216, pp. 162-168.

(Continued)

*Primary Examiner*—Anh Phung
(74) *Attorney, Agent, or Firm*—Robert J. Depke; Rockey, Depke & Lyons, LLC.

(57) ABSTRACT

A magnetic memory device in which the memory cell of MRAM is reduced in size, and a method for producing the magnetic memory device are provided. The lower wiring is formed below the word line. The connecting hole and the plug connected to it are provided. The reading wiring and the lower layer wiring are connected through this plug. Alternatively, the local wiring is provided in the connecting hole and the reading wiring and the lower layer wiring are connected. In this way it is possible to form the connecting hole close to the word line, and hence it is possible to reduce the cell size in the direction along the bit line.

18 Claims, 36 Drawing Sheets

OTHER PUBLICATIONS

D.D. Tang et al., An IC Process Compatible Nonvolatile Magnetic RAM IEDM'95, pp. 997-999.

R.Meservey, Spin-Polarized Electron Tunneling Physics Reports 238 (4) (1994) pp. 214-217.

T. Miyazaki et al., Giant magnetic tunneling effcet in FE/AI2O3/Fe junction, J. Man. Magn Mater. 139 (1995) L231-L234.

R.Scheuerlein et al., A 10ns Read and Write Non-Volatile Memory Array Using a Magnetic Tunnel Junction and FET Switch in each Cell, ISSCC, 2000 pp. 128-129.

* cited by examiner

F I G. 6 A
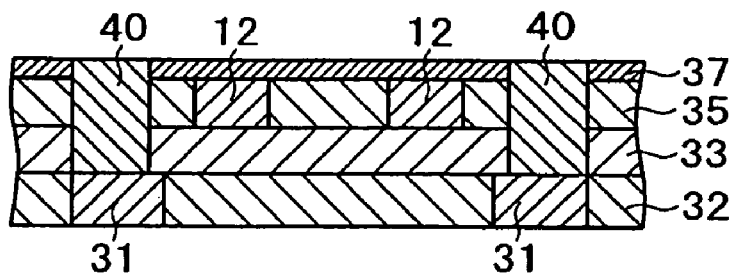
F I G. 6 B
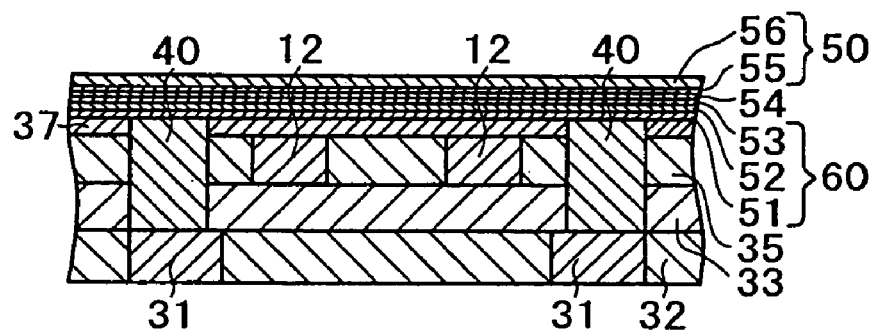
F I G. 6 C
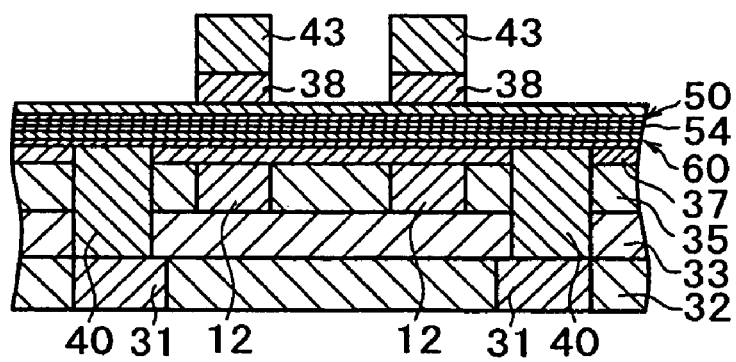
F I G. 6 D
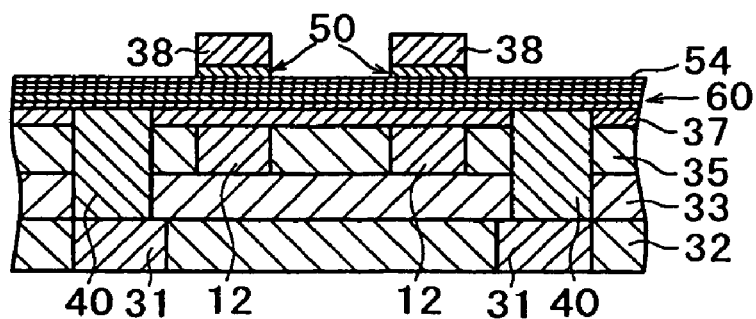

F I G. 7 A
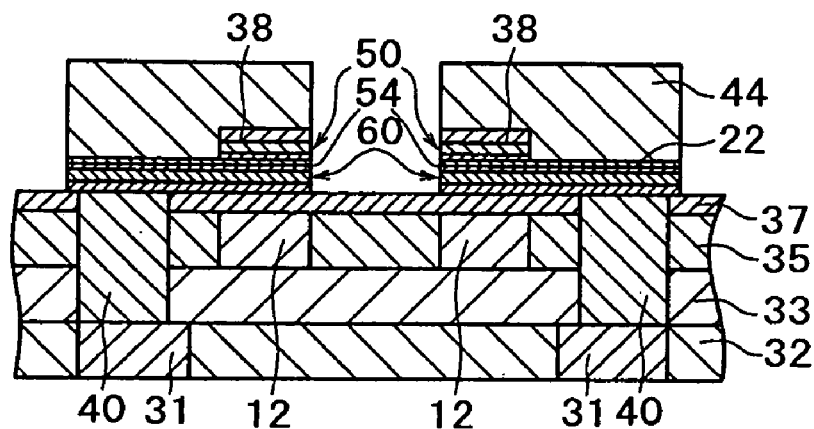
F I G. 7 B
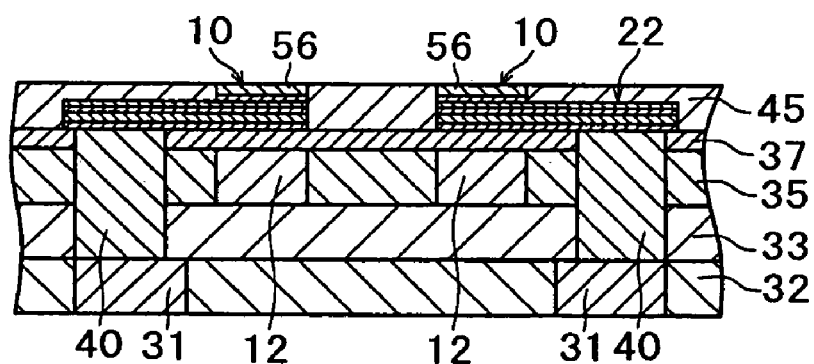
F I G. 7 C
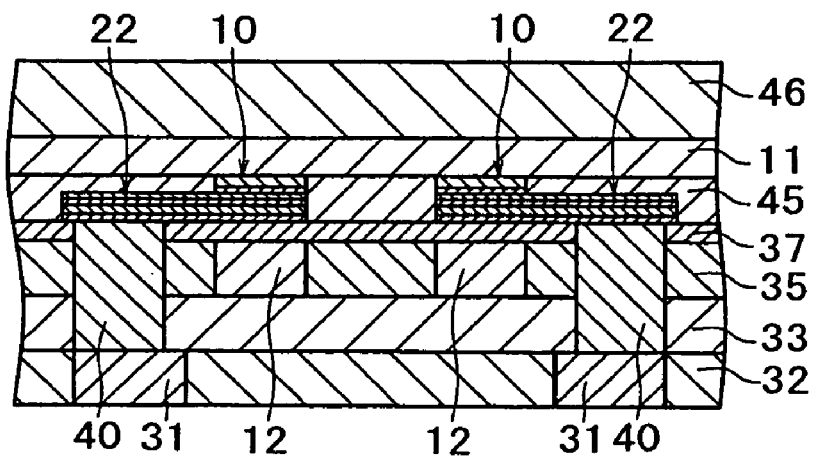

F I G. 13 A
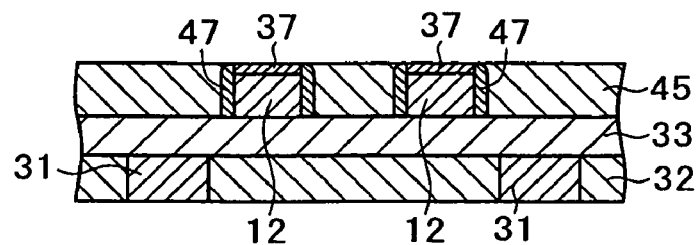
F I G. 13 B
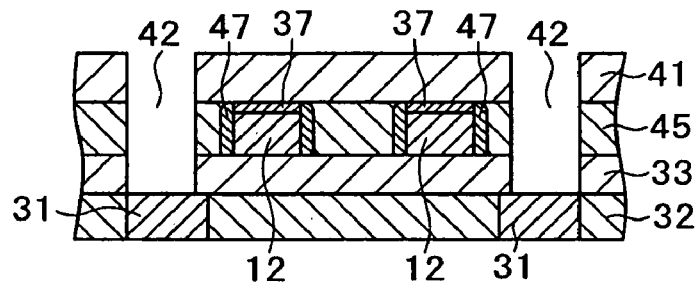
F I G. 13 C
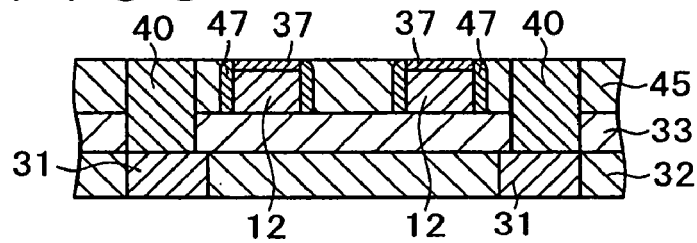
F I G. 13 D
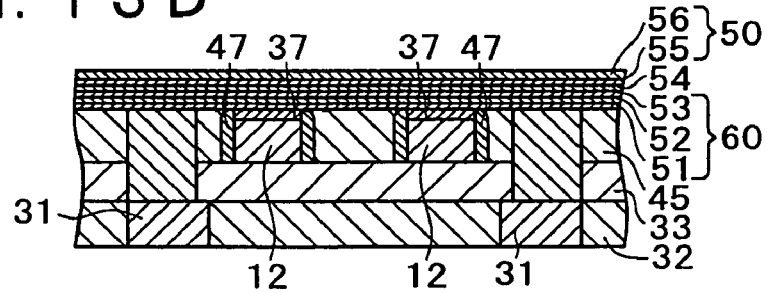
F I G. 13 E
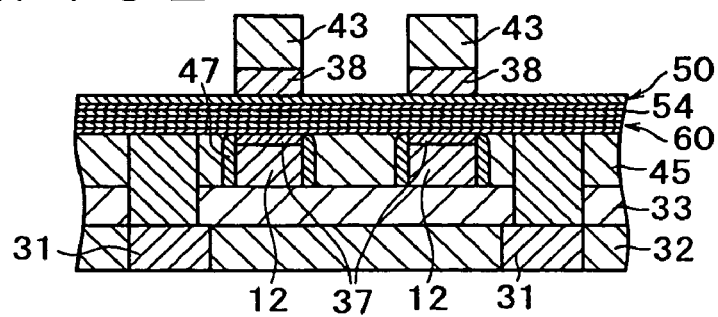

MAGNETIC MEMORY DEVICE AND METHOD FOR PRODUCTION THEREOF

The present application is a continuation of U.S. Ser. 11/007,381, now U.S. Pat. No. 7,095,650, issued on Aug. 22, 2006, filed Dec. 8, 2004, which claims priority to Japanese Patent Application No. 2003-416601 filed Dec. 15, 2003, both of which are incorporated herein by reference.

BACKGROUND OF THE INVENTION

The present invention relates to a magnetic memory device and a method for production thereof. The magnetic memory device is a magnetic random access memory (MRAM) of nonvolatile type consisting of memory elements each having a magnetization pinned layer in which the direction of magnetization is pinned and a magnetic layer in which the direction of magnetization is variable, with one laid on top of the other.

The recent wide spread of information and communications equipment, particularly personal small ones such as portable terminals, requires their constituents (such as memory elements and logic elements) to have improved performance, including high integration, high speed, and low power consumption.

Particularly, non-volatile memory is regarded as indispensable in the age of ubiquitous computing because it preserves personal important information in case of dead battery and network failure or server breakdown. Recent portable equipment is so designed as to reduce power consumption as much as possible by keeping idle circuit blocks in stand-by mode. It would be possible to save power and memory if a non-volatile memory functioning as both high-speed work memory and high-capacity storage memory is realized. It would make the "instant-on function" feasible which permits equipment to start working instantly as soon as power is turned on.

Among non-volatile memory are flush memory, which relies on semiconductors, and FRAM (ferroelectric random access memory), which relies on ferroelectric substances.

Flush memory is limited in writing speed to the order of microseconds. FRAM is also limited in the number of rewriting cycles to $10^{12}$ to $10^{14}$, that is, it is too poor in endurance to replace SRAM (static random access memory) and DRAM (dynamic random access memory). Moreover, it presents difficulties in microprocessing of ferroelectric capacitors therein.

There is noteworthy non-volatile memory free of these disadvantages, which is magnetic memory called MRAM (Magnetic Random Access Memory). MRAM in the early stage is one which is based on spin valve. It utilizes the AMR (Anisotropic Magneto Resistive) effect, which was reported by J. M. Daughton in "Thin Solid Films", vol 216 (1992), pp. 162 to 168. Alternatively, it utilizes the GMR (Giant Magneto Resistance) effect, which was reported by D. D. Tang et al. in "IEDM Technical Digest" (1997), pp. 995 to 997. Unfortunately, they have the disadvantage that the memory cell has a low resistance of 10-100Ω which leads to a large power consumption per bit for reading. This disadvantage makes it difficult to realize a large-capacity memory.

There is another type of MRAM which utilizes the TMR (Tunnel Magneto Resistance) effect. It has come to attract attention because of its remarkable increase in the rate of change in resistance from 1 to 2% at room temperature (as reported by R. Meservey et al. in "Physics Reports", vol. 238, pp. 214 to 217, 1994) to nearly 20% (as reported by T. Miyazaki et al. in "J. Magnetism & Magnetic Material", vol. 139, (L231), 1995).

MRAM is a semiconductor magnetic memory that relies on the magnetoresistance effect resulting from spin dependent conduction of nanomagnetic substances. It is a nonvolatile memory that retains memory without external power supply.

MRAM has such a simple structure that it can be highly integrated with ease. It is capable of rewriting many times because it relies on the rotation of magnetic moment for recording. It is also expected to have a very high access speed. In fact, its ability to run at 100 MHz has been reported by R. Scheuerlein et al. in ISSCC Digest of Technical Papers, pp. 128 to 129, Feb. 2000.

MRAM is broadly divided into two types. One is crosspoint type and the other is 1T1J type or 2T2J type. MRAM of cross-point type is disclosed in U.S. Pat. No. 5,640,343. MRAM of 1T1J type consists of one selecting element and one TMR element. MRAM of 2T2J consists of two selecting elements and two TMR elements which are complementary to each other.

The MRAM consisting of one selecting element and one TMR element is shown in FIG. 33. The memory cell (or memory element) of MRAM is the TMR element 10, which consists mainly of a supporting substrate 9 and a memory layer 2 (in which the direction of magnetization rotates comparatively easily) and two magnetization pinned layers 4 and 6.

The magnetization pinned layer consists of a first magnetization pinned layer 4 and a second magnetization pinned layer 6. Between these two layers is interposed a conducting layer 5 through which they are coupled antiferromagnetically.

The memory layer 2 and the magnetization pinned layers 4 and 6 are formed from a ferromagnetic material such as nickel, iron, cobalt, and alloys thereof. The conducting layer is formed from any of ruthenium, copper, chromium, gold, and silver. The second magnetization pinned layer 6 is in contact with the antiferromagnetic material layer 7, so that it has a strong unidirectional magnetic anisotropy due to exchange interaction between these layers. The antiferromagnetic material layer 7 may be formed from a manganese alloy with iron, nickel, platinum, iridium, or rhodium, or a cobalt oxide or nickel oxide.

Between the memory layer 2 (which is a magnetic layer) and the first magnetization pinned layer 4 is interposed a tunnel barrier layer 3 formed from an insulating material such as an oxide or nitride of aluminum, magnesium, or silicon. It cuts off the magnetic coupling between the memory layer 2 and the magnetic pinned layer 4, and it also permits tunnel current to flow. The magnetic layer and the conductor film are formed mainly by sputtering. The tunnel barrier layer 3 may be formed by oxidizing or nitriding the metal film which has been formed by sputtering. The top coat layer 1 prevents mutual diffusion between the TMR element 10 and the wiring connected thereto. It also reduces contact resistance and protects the memory layer 2 from oxidation. It is usually formed from Cu, Ta, or TiN. The underlying electrode layer 8 serves for connection between the TMR element and a switching element connected thereto in series. This underlying layer 8 may function also as the antiferromagnetic layer 7.

The memory cell constructed as mentioned above reads information by detecting the change in tunnel current due to magnetoresistance effect (which will be described later). The magnetoresistance effect depends on the relative direction of magnetization of the memory layer and the magnetization pinned layer.

FIG. 34 is a partly simplified enlarged perspective view of an ordinary MRAM, with reading circuits omitted for brevity. This MRAM has nine memory cells and mutually intersecting bit lines 11 and writing word lines 12. Each TMR element 10 is placed at the point of intersection. Writing into the TMR element 10 is accomplished by applying current to the bit line 11 and the writing word line 12 simultaneously so that the two currents produce a combined magnetic field which changes the direction of magnetization of the magnetic layer 2 of the TMR element 10 parallel or antiparallel with respect to the magnetization pinned layer.

FIG. 35 is a schematic sectional view showing a memory cell which has a four-layered metal wiring. This memory cell is composed a reading n-type field effect transistor 19, a writing word line 12, a TMR element 10, and a bit line 11, which are arranged one over another. The field effect transistor 19 is composed of, for example, a p-type silicon semiconductor substrate 13 and a p-type well region 14 formed thereon, in which are formed a gate insulating film 15, a gate electrode 16, a source region 17, and a drain region 18. To the source region 17 is connected to a sense line through a source electrode 20. The field effect transistor 19 functions as a switching element for reading. The reading wiring 22 leading out between the word line 12 and the TMR element 10 is connected to the drain region 18 through the contact plugs 27a to 27c and the landing pads 28a to 28c in the insulating layers 29a to 29g of laminate structure placed between the reading wiring 22 and a drain electrode 23. Incidentally, the transistor 19 may be an n-type or p-type field effect transistor or any other switching element such as diode, bipolar transistor, and MESFET (metal semiconductor field effect transistor).

FIG. 36 is an equivalent circuit diagram of MRAM. It is assumed that this MRAM has six memory cells and mutually intersecting bit lines 11 and writing word lines 12. At each point of intersection are arranged a memory element 10 and a field effect transistor 19 connected thereto. The field effect transistor 19 is connected also to a sense line 21 so that it selects the element at the time of reading. The sense line 21 is connected to a sense amplifier 21b, so that stored information is detected. There are also shown a bidirectioal current drive circuit 24 for the writing word line and a current drive circuit 25 for the bit line.

FIG. 37 is an asteroid curve showing the writing condition for MRAM. It represents the reversal threshold value in the direction of magnetization of the memory layer by the magnetic field $H_{EA}$ applied in the direction of easy axis and the magnetic field $H_{HA}$ applied in the direction of hard axis. The combined magnetic field vector outside the asteroid curve brings about the reversal of magnetic field. By contrast, the combined magnetic field vector within the asteroid curve does not reverse the cell from one bistable state into the other. Any cell which is not at the intersection of the word line and the bit line receives the magnetic field generated individually by them, and it has its direction of magnetization reversed if the magnitude of the magnetic field is larger than the one-direction reversal magnetic field $H_k$. Consequently, only if the combined magnetic field is in the gray area, the selected cell permits selective writing.

As mentioned above, MRAM usually performs writing by means of two writing lines (the bit line and the word line), which reverse the magnetic spin in a specified cell owing to the characteristics of asteroid magnetization reversal. The combined magnetization in a single memory region is determined by the vector synthesis of the magnetic field $H_{EA}$ in the direction of easy axis and the magnetic field $H_{HA}$ in the direction of hard axis, both applied to the memory region. Current flowing through the bit line applies to the cell the magnetic field $H_{EA}$ in the direction of easy axis, and current flowing through the writing word line applies to the cell the magnetic field $H_{HA}$ in the direction of hard axis.

FIG. 38 illustrates the reading action by MRAM. Each TMR element 10 in MRAM is of layer structure as schematically shown. The magnetization pinned layer (mentioned above) is represented by a single layer 26, and other layers are omitted except for the memory layer 2 and the tunnel barrier layer 3.

As mentioned above, the writing of information is accomplished by applying current to the bit lines 11 and word lines 12 which are arranged in a matrix pattern. Current applied to these lines produces a combined magnetic field at the point of their intersection, thereby reversing the magnetic spin of the cell. The direction of magnetic spin represents either "1" or "0" as information. The reading of information is accomplished by using TMR effect resulting from magnetoresistance effect. TMR effect is a phenomenon that resistance varies depending on the direction of magnetic spin. High resistance (with the magnetic spin antiparallel) represents "1" and low resistance (with the magnetic spin parallel) represents "0". The reading of information is accomplished as follows. Reading current (tunnel current) is applied across the word line 12 and the bit line 11, and output in proportion to resistance is detected by the sense line 21 through the field effect transistor 19 for reading.

In the case of MRAM consisting of one selecting element and one TMR element as shown in FIG. 35, it is necessary to electrically insulate the TMR element 10 by an insulating layer from the writing word line 12 (referred to as word line for short hereinafter) which intersects with the bit line 11. This makes it necessary to provide connecting holes for connection between the reading wiring 22 and other wiring layers (lower or upper layers). Moreover, there should be a certain distance between the word line 12 and the landing pad 28c in the same layer. Therefore, the size of the memory cell of the MRAM cannot be equal to or smaller than 8F2.

In other words, even though the TMR element 10 shown in FIG. 39 has an aspect ratio of 1:1 (A:B), the size of the memory cell of the MRAM cannot be equal to or smaller than 8F2 (or 2F×4F) in the direction of the bit line. (The aspect ratio of 1:1 means that the TMR element 10 is approximately round and 3F is reduced to 2F in the direction in which it intersects with the bit line 11.) However, as mentioned later, it is necessary that the shape of the TMR element 10 should be elongated in the direction in which it intersects with the bit line 11. Therefore, it becomes an ellipse with an aspect ratio of 1:2, as shown in FIG. 39.

As mentioned above, there has been proposed means to solve problems with MRAM of such structure that the lower layer wiring exists in the same layer as the word line. (Refer to U.S. Pat. No. 5,940,319 (p. 5, column 5, lines 45 to 56, and FIG. 10).) However, the proposed means for solution is not necessarily satisfactory.

FIG. 39 is a schematic diagram showing a conventional MRAM (of 1T1J type) consisting of one selecting element and one TMR element. FIG. 39A is a partial plan view, and FIG. 39B is a sectional view taken along the line b-b in FIG. 39A. As shown in FIG. 39B, the word line 12 is electrically insulated from the TMR element 10 by an insulating layer (not shown). The TMR element 10, which is connected to the bit line 11, is connected to the landing pad 28, which is arranged on the same layer as the word line 12, through the reading wiring 22. This landing pad 28 is further connected to the lower layer wiring 30 through the plug 27.

FIG. 39 shows the size of the memory cell of the MRAM. As FIG. 39A shows in plan, there should be a distance of F/2 between the boundary C of adjacent memory cells and the landing pad 28, between the boundary C of adjacent memory cells and the word line 12, and between the landing pad 28 and the word line 12. Therefore, a length of 4F is necessary in the direction along the bit line 11. On the other hand, a width of 3F is necessary in the direction of intersection with the bit line 11. (The width of 3F is a sum of the distance F/2 between the boundary C of adjacent memory cells and the width (2F) of the bit line 11.) In actual, the TMR element 10 is formed elliptic, such that the aspect ratio A:B (where A is the minor axis of ellipse and B is the major axis of ellipse) is 1:2 from the standpoint of easy magnetization. Therefore, the length in the direction of intersection with the bit line 11 cannot be made smaller than 3F.

In brief, the memory layer of the TMR element practically has its direction of energetically stable magnetic moment determined by its shape anisotropy. Therefore, it is necessary that the aspect ratio of the TMR element pattern should be larger than 2 so that the reversal of magnetization takes place with a minimum of variation. The result is that the cell size cannot be made smaller than 12F2, which is calculated from (F+3F)×(2F+F), where F is the shorter side of TMR element and 2F is the longer side of TMR element. In this case, a space of F/2 should be provided between the side of the landing pad 28 and the word line and between the side of the landing pad 28 and the hole (not shown) for connection of the reading wiring 22 to the lower layer wiring 30. (The second space is equivalent to the width of the plug 27.) That is, the distance between the word line 12 and the connecting hole should be F.

SUMMARY OF THE INVENTION

It is an object of the present invention to provide a magnetic memory device with a reduced cell size and a method for production thereof.

According to the present invention, there is provided a magnetic memory device including memory elements based on tunnel magnetoresistance effect elements, each consisting of a magnetization pinned layer in which the direction of magnetization is pinned, a tunnel barrier layer, and a magnetic layer in which the direction of magnetization is variable, which are laid one over another, a first conducting layer formed on one side of the memory element with an insulating layer interposed therebetween, and a second conducting layer formed on the other side of the memory element. Information is written into the memory element by applying current to a first conducting layer and also to a second conducting layer. Written information is read out of the memory element through a reading wiring of the memory element which is attached to the connecting hole formed in the insulating layer. The reading wiring is connected to a lower wiring existing below the first conducting layer without passage through the conducting layer in the same level as the first conducting layer. (The magnetic memory device mentioned above will be referred to as "the magnetic memory device of the present invention" hereinafter.)

According to the present invention, there is provided a method for producing a magnetic memory device having memory elements based on tunnel magnetoresistance effect, each consisting of a magnetization pinned layer in which the direction of magnetization is pinned, a tunnel barrier layer, and a magnetic layer in which the direction of magnetization is variable, which are laid one over another, such that information is written into the memory element as current is applied to a first conducting layer formed on one side of the memory element with an insulating layer interposed therebetween and also to a second conducting layer formed on the other side of the memory element and written information is read out of the memory element through a reading wiring of the memory element which is attached to the connecting hole formed in the insulating layer. The method including a step of embedding a lower wiring to be connected to the reading wiring in the first insulating layer formed below the first conducting layer, a step of forming the connecting hole through the second insulating layer in which the first conducting layer has been embedded, and a step of connecting the reading wiring to the lower wiring through the connecting hole.

According to the present invention, the lower wiring to be connected to the reading wiring is embedded in the first insulating layer below the first conducting layer and the reading wiring is connected to the lower wiring through the connecting hole which is formed through the second insulating layer in which the first conducting layer has been embedded. The effect of this construction is that the space between the connecting hole and the first conducting layer can be reduced more than in the case where the lower wiring is formed in the same level as the first conducting layer. This offers the advantage of reducing the size of the memory cell containing memory elements.

BRIEF DESCRIPTION OF THE DRAWINGS

FIG. 6A to 6D is a diagram showing the process for production of MRAM according to Embodiment 1-2 of the present invention;

FIG. 7A to 7C is a diagram showing the process for production of MRAM according to Embodiment 1-2 of the present invention;

FIG. 13A to 13E is a diagram showing the process for production of MRAM according to Embodiment 2-2 of the present invention;

FIG. 39 is a schematic diagram showing a conventional MRAM consisting of one selecting element and one TMR element.

DESCRIPTION OF THE PREFERRED EMBODIMENTS

In their preferred embodiments of the magnetic memory device and production method of the present invention, the reading wiring should be extended to and connected to the conducting plug attached to the connecting hole on the lower wiring.

Also, the reading wiring may be connected to the lower wiring by the local wiring connected to the side of the conducting layer below the tunnel barrier layer constituting the memory element.

In this case, the reading wiring should preferably be connected to the lower wiring through the connecting hole on the lower wiring.

Further, the plug should preferably be formed at the position as high as the insulating layer or at the position lower than the first conducting layer.

And, at least the side of the first conducting layer should be covered with a material having etch-selectivity for the insulating layer in which the first conducting layer has been embedded. This is desirable for processing steps.

Also, the constituent layer above the magnetization pinned layer of the memory element is patterned, and at least the side of this pattern is covered with a material having etch-selectivity for the lower constituent layer below the upper constituent layer and the insulating layer in which at least the first conducting layer has been embedded. This is desirable for processing steps.

The foregoing makes it possible to produce a desirable magnetic memory device which is constructed such that an insulating layer is formed between the magnetization pinned layer and the magnetic layer, the bit line and word line, which are formed above and below the memory element, induce a magnetic field upon current application to magnetize the magnetic layer in the prescribed direction, thereby writing information, and the written information is read by means of the tunnel magnetoresistance effect through the insulating layer as the tunnel barrier layer.

The preferred embodiments of the present invention will be described below in more detail with reference to the accompanying drawings.

Figure 39A:
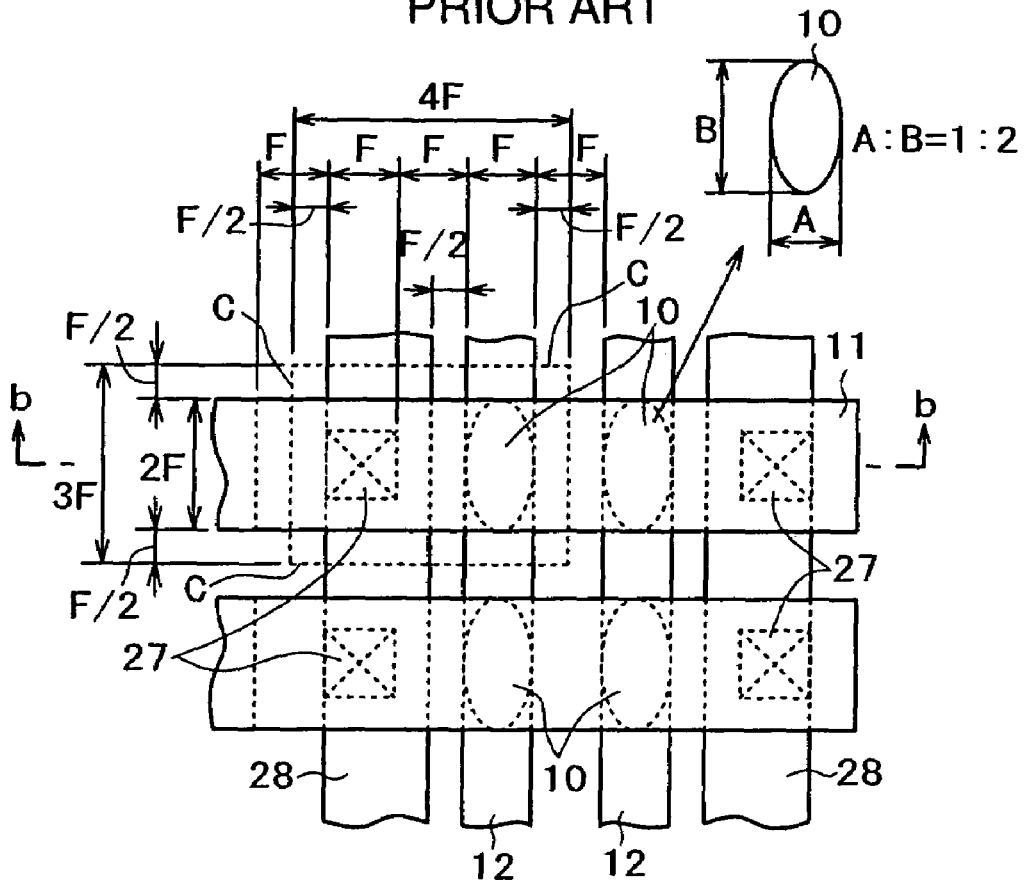
FIG. 39A is a plan view.
Figure 39B:
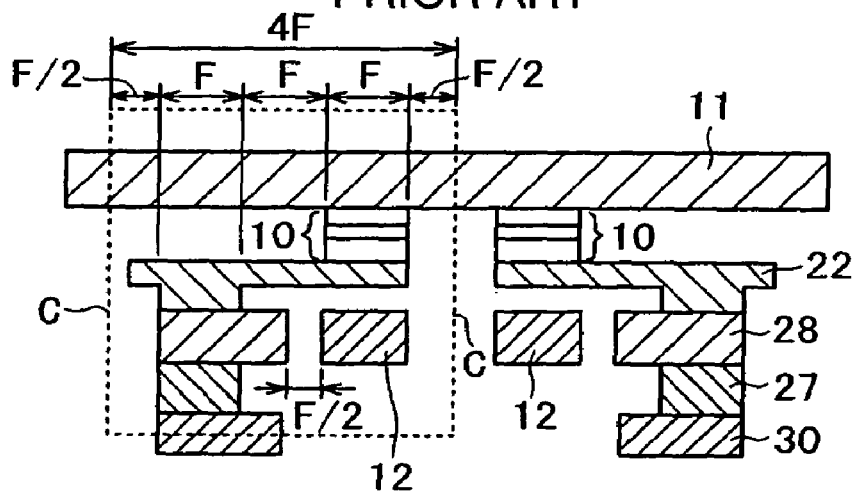
FIG. 39B is a sectional view taken along the line b-b in FIG. 39A.

The embodiments described below are improved in connection between the reading wiring 22 and the lower layer wiring (not shown) over the conventional product shown in FIG. 39B, so as to reduce the size of the memory cell of MRAM. It is assumed that the TMR element has an aspect ratio of 2. Writing variation decreases as the aspect ratio increases. The same symbols are used for the common parts in the drawings.

Embodiment 1

Figure 1A:
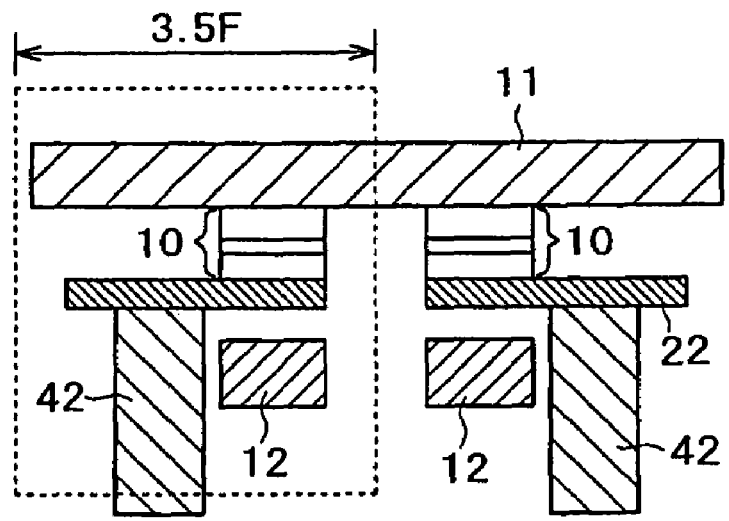
FIG. 1A is a schematic diagram showing the structure of the MRAM according to Embodiment 1 of the present invention.
Figure 1B:
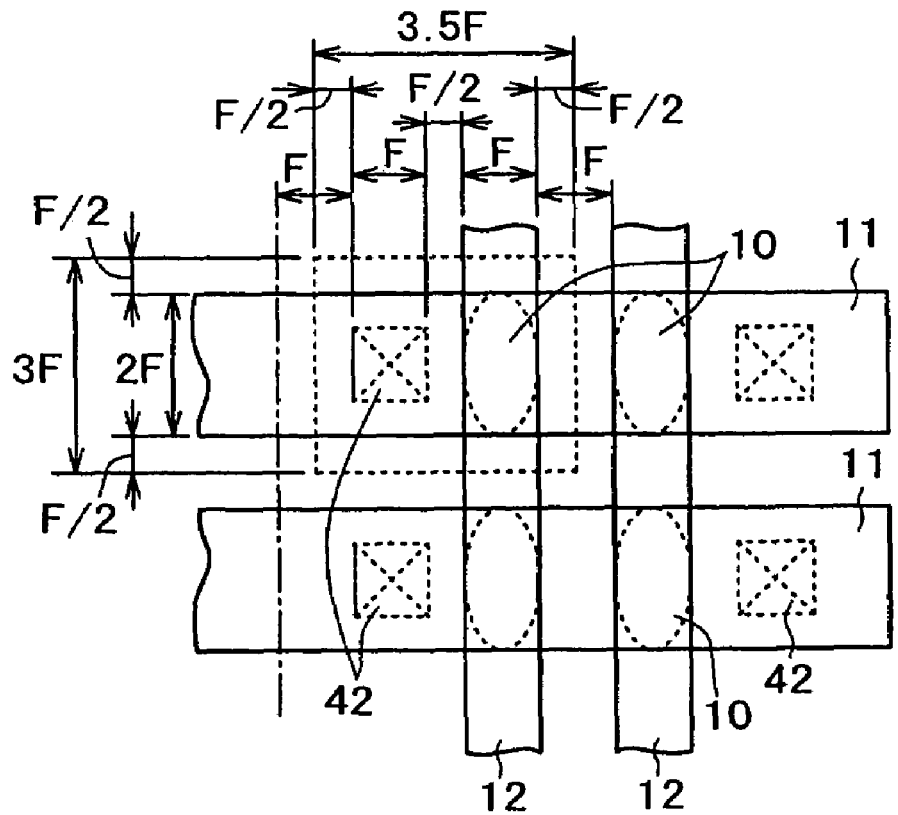
FIG. 1B is a schematic plan view of the MRAM according to Embodiment 1 of the present invention.

FIG. 1A is a schematic diagram showing the structure of the MRAM according to this embodiment. FIG. 1B is a schematic plan view of the MRAM according to this embodiment. As shown in these figures, the MRAM is constructed such that the landing pad does not exist at the same level as the word line 12, and the reading wiring 22 is connected to the lower layer wiring (not shown) through the connecting hole 42. This structure makes it possible to bring the connecting hole 42 closer (by F/2) to the word line 12. In this way it is possible to decrease the size in the direction along the bit line 11 to 3.5F.

Embodiment 1-1

The production process will be described with reference to FIGS. 2 to 4. In these figures, MOS transistors etc. under the lower layer wiring are not shown. The same shall apply to other embodiments that follow.

Figure 2A:
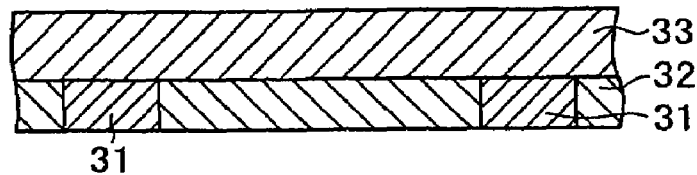
FIG. 2A to 2F is a diagram showing the process for production of MRAM according to Embodiment 1-1 of the present invention.
Figure 2B:
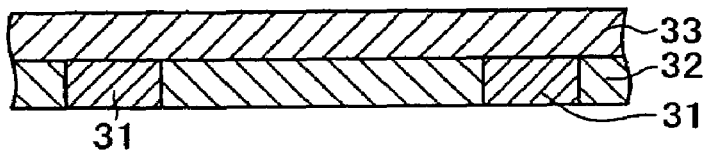

On the lower layer wiring 31 (600 nm thick) are sequentially formed the HDP film 32 (800 nm thick) and the P-TEOS film 33 (1200 nm thick), as shown in FIG. 2A. The HDP film is a silicon oxide film formed by high-density plasma CVD. The P-TEOS film is a silicon oxide film formed from plasma tetraethyl orthosilicate by reduced pressure CVD. Then, CMP (chemical mechanical polishing) is performed such that an insulting film (700 nm thick) is left on the lower layer wiring 31, as shown in FIG. 2B.

Figure 2C:
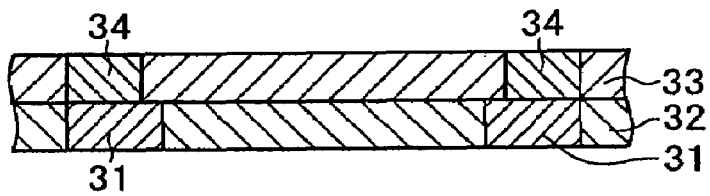

A connecting hole (not shown) for electrical connection to the lower layer wiring 31 is formed by lithography and etching. In this hole is deposited a tungsten film by CVD. (This tungsten film is referred to as W-CVD hereinafter.) Finally, CMP is performed. In this way the W-plug 34 is formed, as shown in FIG. 2C.

Figure 2D:
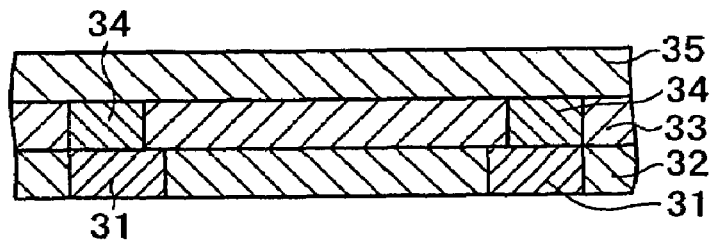
Figure 2E:
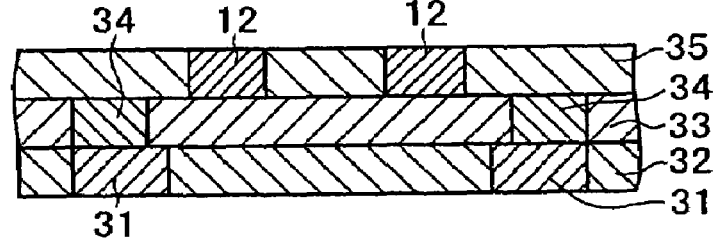
Figure 2F:
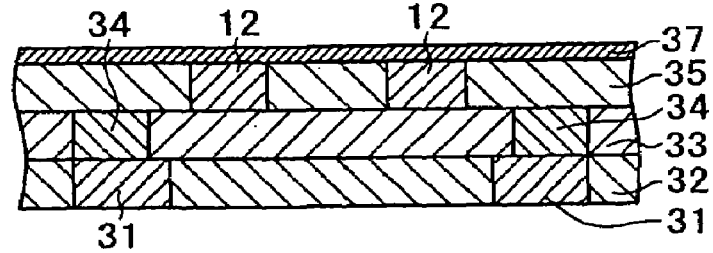

The P—SiN film (50 nm thick) and the P-TEOS film 35 (400 nm thick) are deposited sequentially, as shown in FIG. 2D. The P—SiN film (not shown) is a silicon nitride film formed by plasma. It will be referred to as P—SiN hereinafter. Etching is performed on the P-TEOS film 35 through a photoresist film (not shown) as a mask. Then etching is performed on the P—SiN film to form a wiring groove (not shown). In this groove are sequentially deposited Ta/TaN/Cu seed layers (not shown) by sputtering. The wiring groove is filled by Cu plating. The surface of the wiring groove is planarized by CMP and the Cu wiring 12 (referred to as word line hereinafter) is formed, as shown in FIG. 2E. The P—SiN film 37 (50 nm thick) is deposited, as shown in FIG. 2F. Incidentally, filling of the wiring groove with Cu may also be accomplished by electroless plating in place of electrolytic plating. The same shall apply to other embodiments that follow.

Figure 3A:
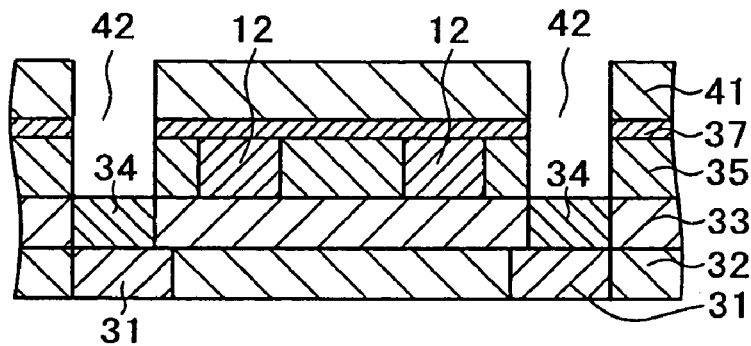
FIG. 3A to 3D is a diagram showing the process for production of MRAM according to Embodiment 1-1 of the present invention.

Etching through the photoresist film 41 as the mask is performed to make the connecting hole 42 which reaches the W-plug 34 formed on the lower layer wiring 31, as shown in FIG. 3A. In this way the lower layer wiring 31 is formed below the word line 12, and there exists no other wiring at the same level as the word line 12. Thus it is possible to form the connecting hole 42 easily by full-wafer etching closer to the word line 12 by F/2.

Figure 3B:
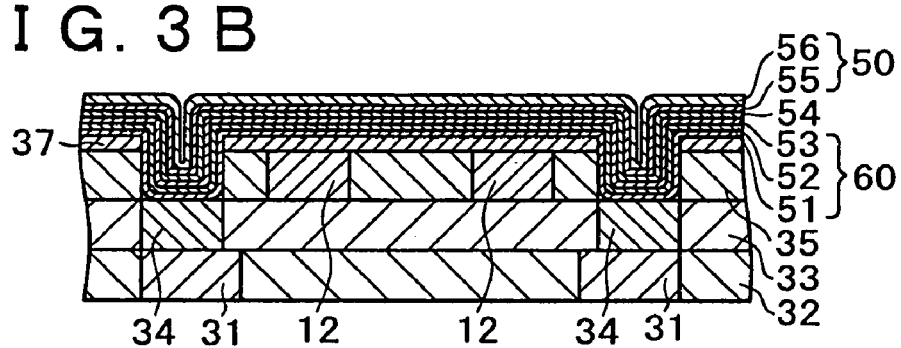

PVD (physical vapor deposition) is performed to form sequentially the barrier layer 51, the antiferromagnetic layer 52, the ferromagnetic layer 53, the tunnel insulating layer 54, the ferromagnetic layer (memory layer) 55, and the cap layer 56, as shown in FIG. 3B. In the following figures, the barrier layer 51, the antiferromagnetic layer 52, and the ferromagnetic layer 53 may be collectively referred to as the pinned layer 60, and the memory layer 55 and the cap layer 56 may be collectively referred to as the free layer 50. The same shall apply to other embodiments that follow.

The barrier layer 51 is formed from titanium nitride, tantalum, or tantalum nitride. The antiferromagnetic layer 52 is formed from iron-manganese, nickel-manganese, platinum-manganese, or iridium-manganese. The ferromagnetic layer 53 is formed from nickel-iron and/or cobalt alloy. The lower ferromagnetic layer 53 has its direction of magnetization spinned by exchange coupling with the underlying antiferromagnetic layer 52. The tunnel insulating layer 54 is usually formed from alumina $Al_2O_3$. It is so thin (0.5 to 5 nm) that it is formed by ALD (atomic layer deposition) method or it is deposited by sputtering with aluminum and subsequent plasma oxidation. The upper ferromagnetic layer 55 is formed also from nickel-iron and/or cobalt alloy. This layer has its direction of magnetization changed parallel or antiparallel with respect to the underlying ferromagnetic layer by the externally applied magnetic field. The cap layer 56 is formed from the same material as used for the barrier layer. The same shall apply to other embodiments that follow.

Figure 3C:
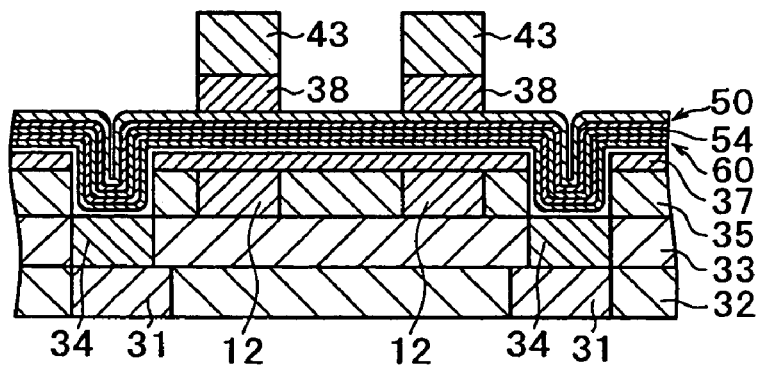

The P-TEOS film 38 (200 nm thick) is deposited, and then it is patterned by reactive ion etching technique through the photoresist film 43 (formed thereon) as the mask, as shown in FIG. 3C.

Figure 3D:
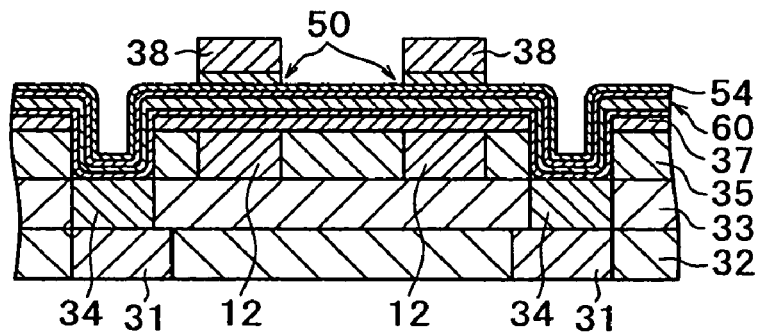

With the photoresist film removed, reactive ion etching is performed on the cap layer 56 and the upper ferromagnetic layer 55 through the P-TEOS film 38 as the mask, as shown in FIG. 3D. This etching should completely remove the upper ferromagnetic layer 55 and then terminates in the tunnel insulating film 54. Also, this etching should be carried out such that the P-TEOS film 38 (thicker than 100 nm) remains on the cap layer 56 and the memory layer 55. The etching gas is a halogen gas containing chlorine or a carbon monoxide gas mixed with $NH_3$.

Figure 4A:
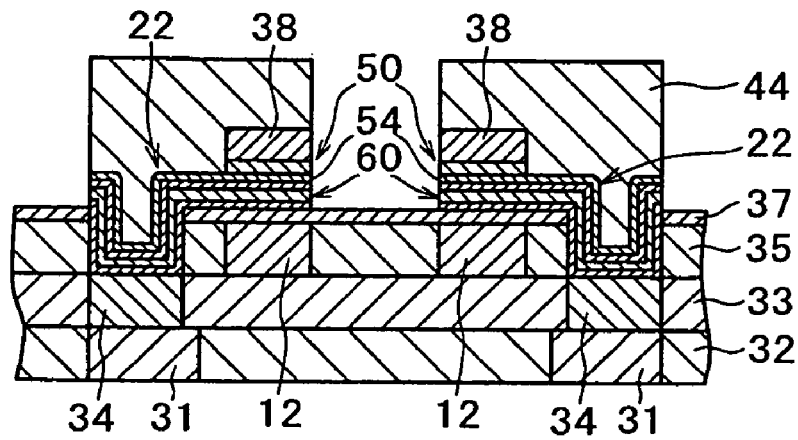
FIG. 4A to 4C is a diagram showing the process for production of MRAM according to Embodiment 1-1 of the present invention.

Etching is performed through the photoresist film 44 and the P-TEOS film 38 as the mask to remove the remainder of the tunnel insulating film 54 and the pinned layer 60 (which consists of the lower ferromagnetic layer 53, the underlying antiferromagnetic layer 52, and the barrier layer 51), thereby forming the wiring pattern connecting to the magnetization pinned layer and the underlying layer, as shown in FIG. 4A. In this way the reading wiring 22 is formed which extends in the connecting hole.

Figure 4B:
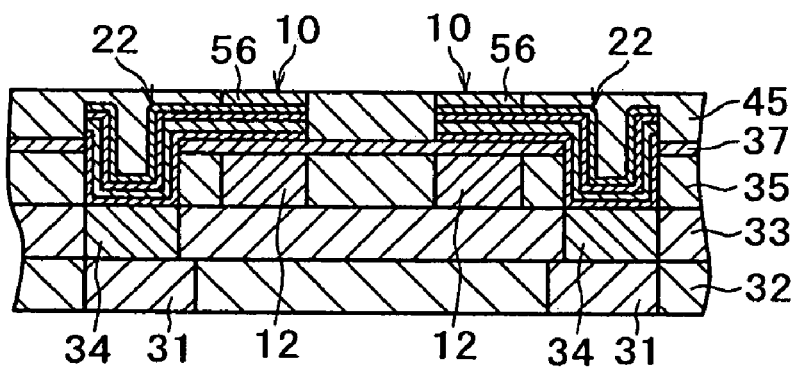

CVD or PVD is performed to deposit the insulating film 45 of $SiO_2$ or $Al_2O_3$ over the entire surface, as shown in FIG. 4B. CMP is performed to planarize the insulating film 45 and the P-TEOS film 38, so that the cap layer 56 (which is the uppermost layer of the TMR) is exposed. The exposed part functions as a self-aligned contact for the bit line.

Figure 4C:
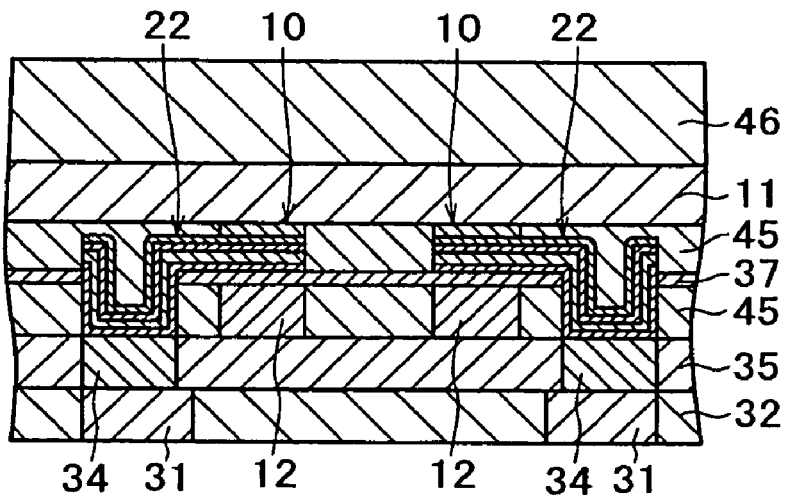

The bit line 11, the peripheral circuit wiring (not shown), and the bonding pad region (not shown) are formed by the standard wiring technology, as shown in FIG. 4C. The plasma silicon nitride film 46 is deposited over the entire surface. Finally, a hole for the bonding pad region is made. Thus, the wafer process for LSI (large scale integration) is completed.

Embodiment 1-2

The production process will be described with reference to FIGS. 5 to 7.

Figure 5A:
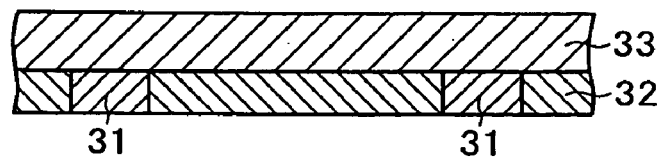
FIG. 5A to 5F is a diagram showing the process for production of MRAM according to Embodiment 1-2 of the present invention.
Figure 5B:
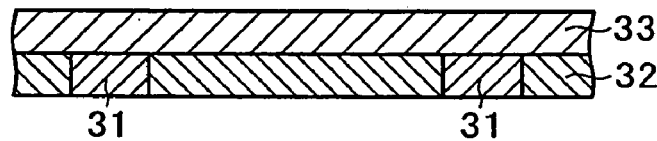

First, a lower layer metal wiring 31 (600 nm) is formed. On this layer are sequentially deposited the HDP film 32 (800 nm thick) and the P-TEOS film 33 (1200 nm thick), as shown in FIG. 5A. CMP is performed such that an insulting film (700 nm thick) is left on the lower layer wiring 31, as shown in FIG. 5B.

Figure 5C:
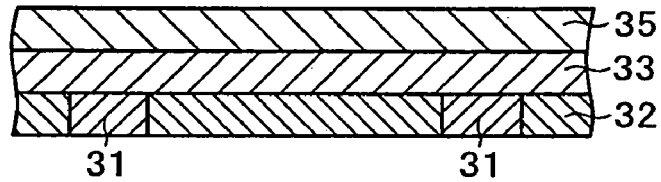
Figure 5D:
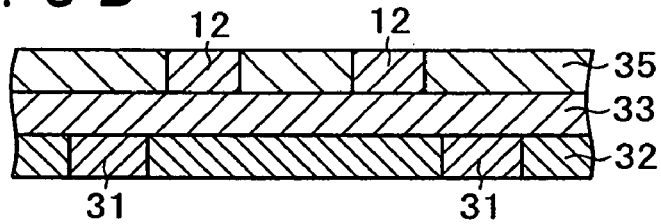
Figure 5E:
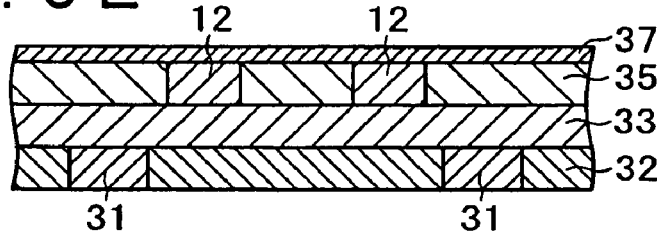

The P—SiN film (50 nm thick) (not shown) and the P-TEOS film 35 (400 nm thick) are sequentially deposited, as shown in FIG. 5C. Etching is performed on the P-TEOS film 35 and the P—SiN film through a photoresist film (not shown) as the mask, so that a wiring groove is formed. In this wiring groove are sequentially deposited Ta/TaN/Cu seed layers by sputtering (not shown). The wiring groove is filled with Cu plating. The surface of the wiring groove is planarized by CMP, and the word line 12 is formed, as shown in FIG. 5D. The P—SiN film 37 (50 nm thick) is deposited, as shown in FIG. 5E.

Figure 5F:
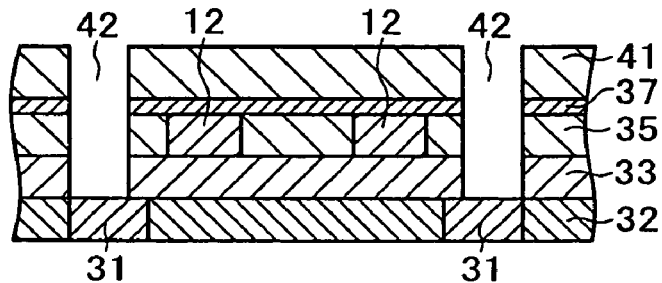

Etching is performed through the photoresist film 41 as the mask so as to make the connecting hole 42 reaching the lower layer wiring 31, as shown in FIG. 5F. In this way, the lower layer wiring 31 is formed below the word line 12. Therefore, there exist no other wiring at the same level as the word line 12 and the connecting hole 42 can be made closer to the word line 12 by F/2. Moreover, in this way they can be formed all at once by etching.

With the W-plug 40 embedded in the connecting hole 42, as shown in FIG. 6A, PVD is performed to deposit the pinned layer 60 and the free layer 50 with the same materials as used in Embodiment 1-1, as shown in FIG. 6B. The pinned layer 60 consists of the barrier layer 51, the antiferromagnetic layer 52, and the ferromagnetic layer 53. The free layer 50 consists of the tunnel insulating film 54, the ferromagnetic layer (memory layer) 55, and the cap layer 56. In this way it is possible to reduce the distance between the word line 12 and the plug 40 for connection to the reading wiring 22 (mentioned later).

The P-TEOS film 38 (200 nm thick) is deposited, and then it is patterned by reactive ion etching through the photoresist film 43 as the mask, as shown in FIG. 6C.

With photoresist film removed, reactive ion etching is performed on the free layer 50 (consisting of the cap layer 56 and the upper ferromagnetic layer 55) through the P-TEOS film 38 as the mask, as shown in FIG. 6D. Etching should be so carried out as to remove the upper ferromagnetic layer 55 completely and then terminates in the tunnel insulating film 54. In addition, etching should be so carried out to leave the P-TEOS film 38 (thicker than 100 nm) on the cap layer 56 and the memory layer 55. The etching gas may be a halogen gas containing chlorine or carbon monoxide mixed with $NH_3$.

Etching is performed on the remainder of the tunnel insulating film 54 and the pinned layer 60 (consisting of the lower ferromagnetic layer 53, the underlying antiferromagnetic layer 52, and the barrier layer 51) through the photoresist 44 and the P-TEOS 38 as the mask, as shown in FIG. 7A, so that the wiring pattern that connects to the magnetization pinned layer and the underlying layer is formed.

The insulating film 45 of $SiO_2$ or $Al_2O_3$ is deposited by CVD or PVD over the entire surface as shown in FIG. 7B. CMP is performed to planarize the insulating film 45 and the P-TEOS film 38, so that the cap layer 56 (the uppermost layer of the TMR) is exposed. The exposed part functions as a self-aligned contact for the bit line.

The bit line 11, the peripheral circuit wiring (not shown), and the bonding pad region (not shown) are formed by the standard wiring technology, as shown in FIG. 7C. The plasma silicon nitride film 46 is deposited over the entire surface. Finally, a hole for the bonding pad region is made. Thus, the wafer process for LSI is completed.

The embodiments 1-1 and 1-2 mentioned above offer the following advantages. The reading wiring 22 (shown in FIG. 1) is connected to the lower layer wiring (not shown) by means of the plug 34 (in Embodiment 1-1) or the plug 40 (in Embodiment 1-2). The plug 34 is formed on the lower layer wiring 31 which is arranged below the word line 12, and the reading wiring 22 is extended into the connecting hole for its connection. The plug 40 is formed in the entire connecting hole reaching the lower layer wiring 31. The arrangement in this manner eliminates the conventional landing pad at the same level as the word line 12; therefore, the connecting hole 42 can be formed close to the word line 12 and the space between the word line 12 and the plug 40 or the reading wiring 22 extending into the connecting hole 42 can be reduced by F/2 as compared with the conventional one shown in FIG. 39. Thus the cell size equal to or smaller than $12F^2$ can be realized.

According to the conventional structure (shown in FIG. 39), the cell size needs $12F^2$, because the space in the direction along the bit line 11 needs 4F and the space in the direction intersecting with the bit line 11 needs 3F. (F denotes half the pitch of the design rule.) The size of 4F in the direction along the bit line 11 is necessary to accommodate the writing word line and the landing pad for connection to the underlying layer in the same wiring layer.

By contrast, the structure in the embodiments mentioned above has no landing pads, so that connection is made directly to the lower layer wiring 31 through the plug. This structure only needs a space of F/2 to secure breakdown voltage and to provide an allowance for overlapping of the word line 12 and the plug. Assuming a design rule of 0.18 µm, F will be 0.27 µm. If 0.12 µm is assumed for the allowance for breakdown voltage and overlapping, then 0.12 µm is equal to or smaller than 0.5F (0.12/0.27=0.44<0.5). This means that the space in the direction along the bit line is reduced by 0.5F to 3.5F. Thus, the size of the memory cell will be $10.5F^2$ (3.5F in the direction along the bit line×3F in the direction intersecting with the bit line). This size is smaller than that of the conventional structure shown in FIG. 39.

Embodiment 2

Figure 8:
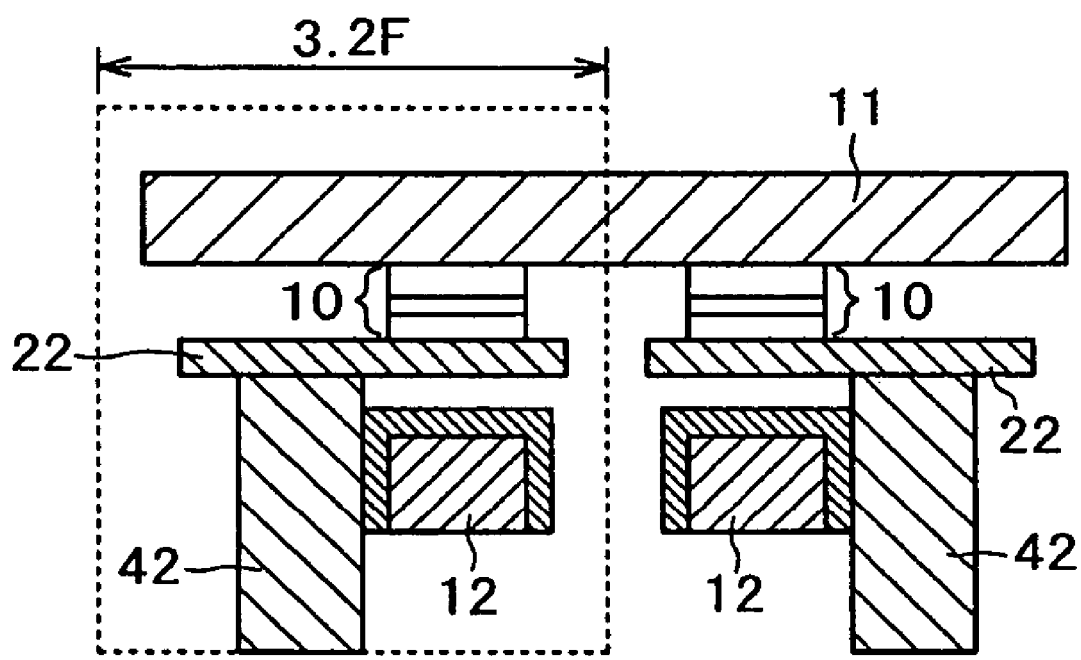
FIG. 8 is a schematic diagram showing the structure of the MRAM according to Embodiment 2 of the present invention.

FIG. 8 is a schematic diagram showing the structure of the MRAM according to this embodiment. As in the case of Embodiment 1, the MRAM is constructed such that the landing pad does not exist at the same level as the word line 12, and the reading wiring 22 is connected to the lower layer wiring (not shown) through the connecting hole 42. If the upper and lateral surfaces of the word line are covered with a breakdown-resistant material with etching selectivity, this structure permits the space between the word line 12 and the connecting hole 42 to be reduced more than that in Embodiment 1. In fact, the structure in Embodiment 2 has the MRAM size reduced to 3.2F (corresponding to 4F in FIG. 39) in the direction along the bit line 11.

Embodiment 2-1

The production process will be described with reference to FIGS. 9 to 11.

Figure 9A:
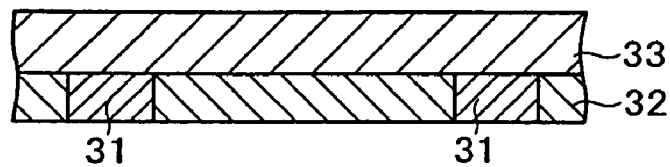
FIG. 9A to 9F is a diagram showing the process for production of MRAM according to Embodiment 2-1 of the present invention.
Figure 9B:
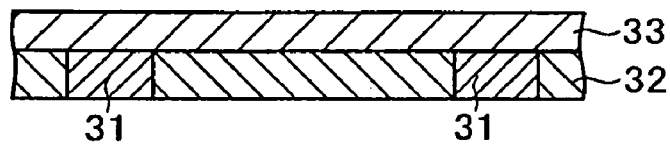

On the lower layer wiring 31 (600 nm thick) are sequentially formed the HDP film 32 (800 nm thick) and the P-TEOS film 33 (1200 nm thick), as shown in FIG. 9A. Then, CMP is performed such that an insulting film (700 nm thick) is left on the lower layer wiring 31, as shown in FIG. 9B.

Figure 9C:
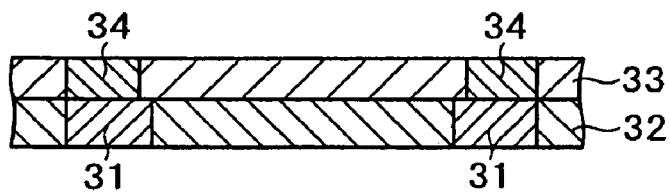

A connecting hole (not shown) for electrical connection to the lower layer wiring 31 is formed by lithography and etching. In this hole is formed the W-plug 34 by W-CVD and ensuing CMP, as shown in FIG. 9C.

Figure 9D:
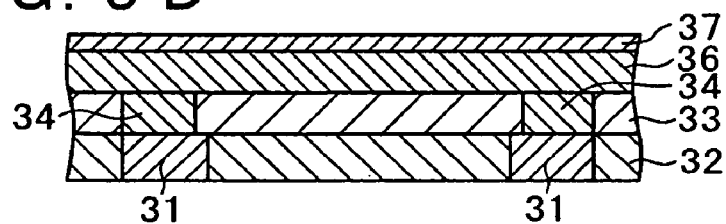
Figure 9E:
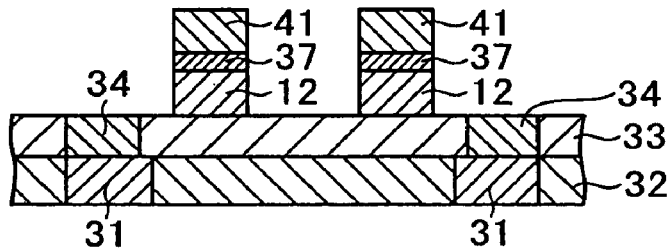

The multi-layer film 36 (such as Ti/TiN/Al-0.5% Cu=10/30/700 nm) is deposited by sputtering, and then the P—SiN film 37 (100 nm thick) is deposited, as shown in FIG. 9D. Etching through the photoresist film 41 as the mask is performed on the P—SiN film 37 and the metal multi-layer film 36 in order to form the word line 12, as shown in FIG. 9E.

Figure 9F:
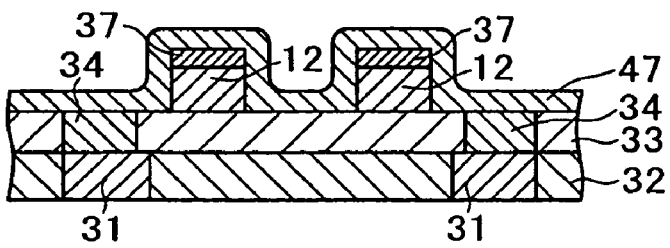
Figure 10A:
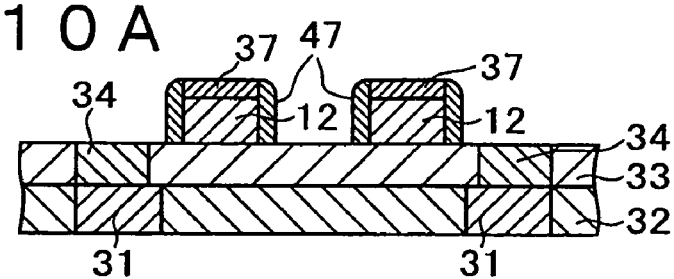
FIG. 10A to 10E is a diagram showing the process for production of MRAM according to Embodiment 2-1 of the present invention.

The P—SiN film 47 (50 nm thick) is deposited and etch-back is performed on it, as shown in FIG. 9F. This step forms the side wall 47 of P—SiN on the lateral surface of the word line 12, as shown in FIG. 10A. The amount of overetching should be set up so that the P—SiN film 37 remains equal to or more than 70 nm on the word line 12.

Figure 10B:
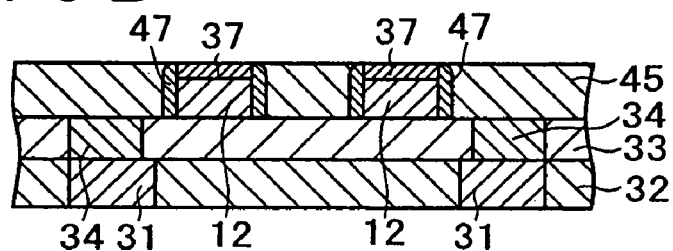

CVD or PVD is performed to deposit the insulating film 45 of $SiO_2$ or $Al_2O_3$ over the entire surface, and CMP is performed to planarize the insulating film 45, so that the P—SiN film 37 is exposed, as shown in FIG. 10B.

Figure 10C:
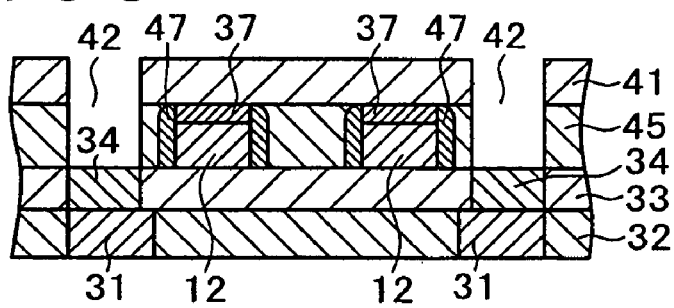

Etching through the photoresist film 41 as the mask is performed to make the connecting hole 42 which reaches the W-plug 34 formed on the lower layer wiring 31, as shown in FIG. 10C. This etching should be carried out with high selectivity for the interlayer insulating film 45 and the P—SiN film 37 and the side wall 47 (formed on the upper and lateral surfaces of the word line 12, respectively). In this way the lower layer wiring 31 is formed below the word line 12, and it is possible to reduce more the distance between the word line 12 and the connecting hole 42 for connection to the plug 34 formed above it. Moreover, it can be easily formed by full-wafer etching.

Figure 10D:
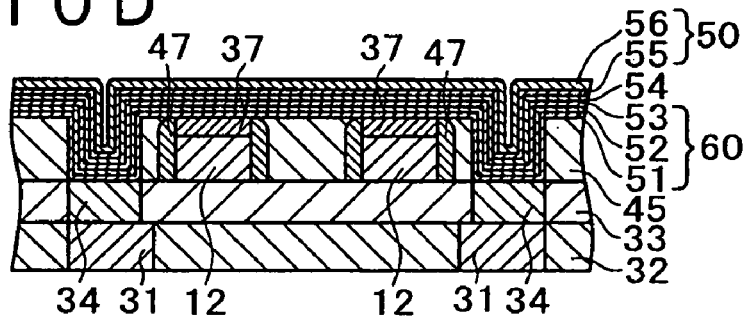

With the resist mask 41 removed, PVD is carried out to sequentially form the pinned layer 60 (consisting of the barrier layer 51, the antiferromagnetic layer 52, and the ferromagnetic layer 53) and the free layer 50 (consisting of the tunnel insulating film 54, the ferromagnetic layer (memory layer) 55, and the cap layer 56) from the same materials as used in Embodiment 1-1, as shown in FIG. 10D.

Figure 10E:
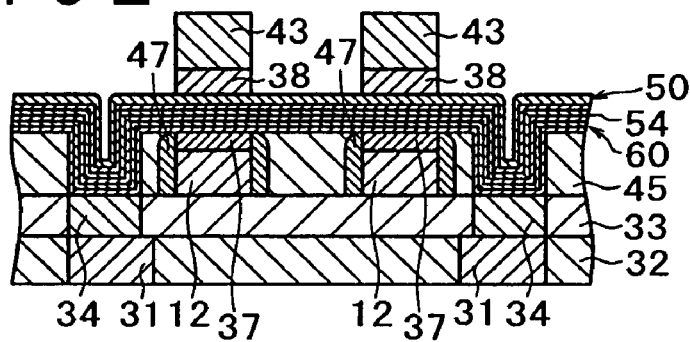

The P-TEOS film 38 (200 nm thick) is deposited and then it is patterned by reactive ion etching through the photoresist film 43 as the mask, as shown in FIG. 10E.

Figure 11A:
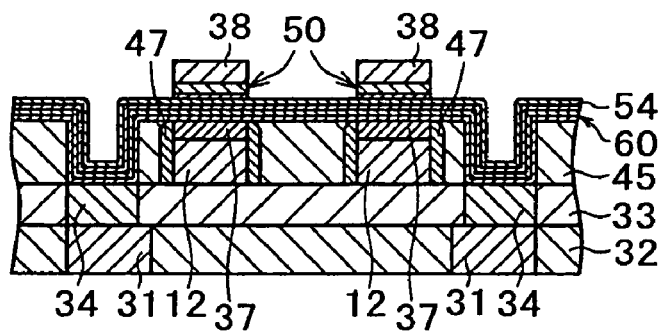
FIG. 11A to 11D is a diagram showing the process for production of MRAM according to Embodiment 2-1 of the present invention.

With the photoresist film removed, reactive ion etching is performed on the free layer 50 (consisting of the cap layer 56 and the upper ferromagnetic layer 55) through the P-TEOS film 38 as the mask, as shown in FIG. 11A. Etching should be carried out such that it terminates in the tunnel insulating film 54 after it has completely removed the upper ferromagnetic layer 55. In addition, etching should be carried out such that the P-TEOS film 38 remains more than 100 nm on the cap layer 56 and the memory layer 55. The etching gas is a halogen gas containing chlorine or a carbon monoxide gas mixed with $NH_3$.

Figure 11B:
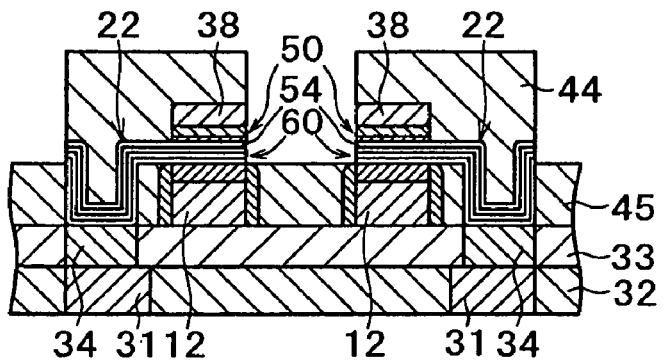

Etching is performed through the photoresist film 44 and the P-TEOS film 38 as the mask to remove the remainder of the tunnel insulating film 54 and the pinned layer 60 (which consists of the lower ferromagnetic layer 53, the underlying antiferromagnetic layer 52, and the barrier layer 51), thereby forming the wiring pattern connecting to the magnetization pinned layer and the underlying layer, as shown in FIG. 11B. In this way the reading wiring 22 is formed which extends in the connecting hole.

Figure 11C:
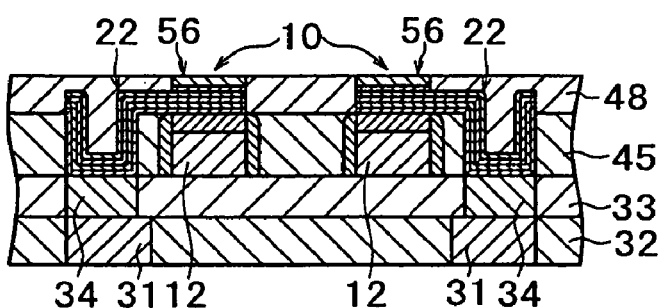

CVD or PVD is performed to deposit the insulating film 48 of $SiO_2$ or $Al_2O_3$ over the entire surface, as shown in FIG. 11C. CMP is performed to planarize the insulating film 48 and the P-TEOS film 38, so that the cap layer 56 (which is the uppermost layer of the TMR) is exposed. The exposed part functions as a self-aligned contact for the bit line.

Figure 11D:
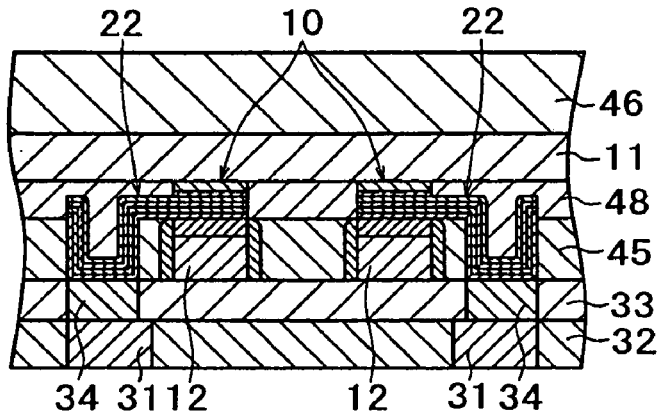

The bit line 11, the peripheral circuit wiring (not shown), and the bonding pad region (not shown) are formed by the standard wiring technology, as shown in FIG. 11D. The plasma silicon nitride film 46 is deposited over the entire surface. Finally, a hole for the bonding pad region is made. Thus, the wafer process for LSI is completed.

Embodiment 2-2

The production process will be described with reference to FIGS. 12 to 14.

Figure 12A:
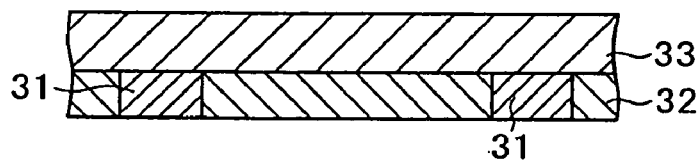
FIG. 12A to 12F is a diagram showing the process for production of MRAM according to Embodiment 2-2 of the present invention.
Figure 12B:
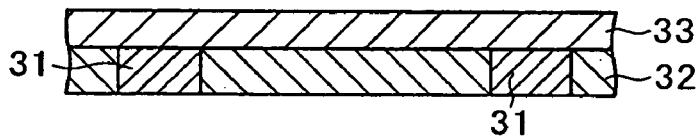

On the lower layer wiring 31 (600 nm thick) are sequentially formed the HDP film 32 (800 nm thick) and the P-TEOS film 33 (1200 nm thick), as shown in FIG. 12A. Then, CMP is performed such that an insulting film (700 nm thick) is left on the lower layer wiring 31, as shown in FIG. 12B.

Figure 12C:
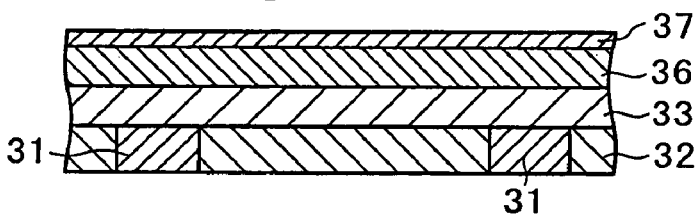
Figure 12D:
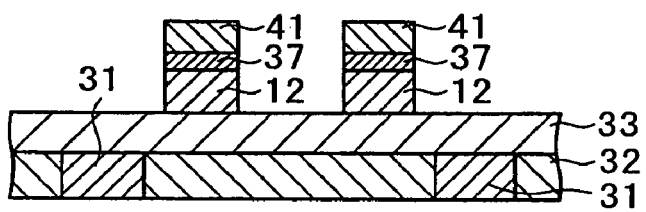

The metal multi-layer film 36 (such as Ti/TiN/Al-0.5% Cu=10/30/700 nm) is deposited by sputtering, and then the P—SiN film 37 (100 nm thick) is deposited, as shown in FIG. 12C. Etching though the photoresist film 41 as the mask is performed on the P—SiN film 37 and the metal multi-layer film 36 in order to form the word line 12, as shown in FIG. 12D.

Figure 12E:
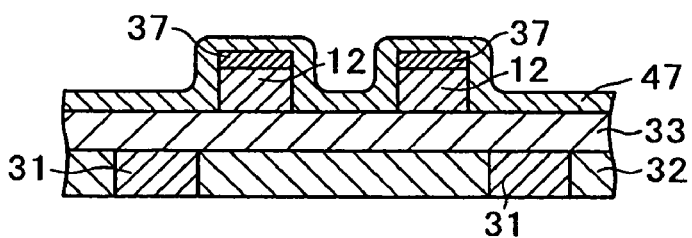
Figure 12F:
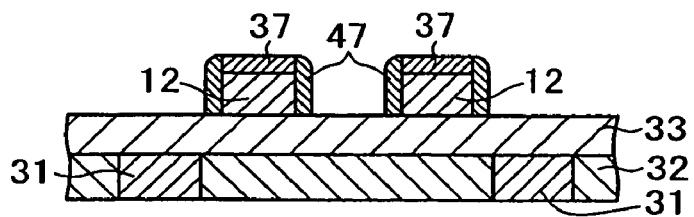

The P—SiN film 47 (50 nm thick) is deposited and etch-back is performed on it, as shown in FIG. 12E. This step forms the side wall 47 of P—SiN on the lateral surface of the word line 12, as shown in FIG. 12F. The amount of overetching should be set up so that the P—SiN film 37 remains more than 70 nm on the word line 12.

CVD or PVD is performed to deposit the insulating film 45 of $SiO_2$ or $Al_2O_3$ over the entire surface, and CMP is performed to planarize the insulating film 45, so that the P—SiN film 37 is exposed, as shown in FIG. 13A.

Etching through the photoresist film 41 as the mask is performed to make the connecting hole 42 which reaches the previously formed lower layer wiring 31, as shown in FIG. 13B. This etching should be carried out with high selectivity for the interlayer insulating film 45 and the P—SiN film 37 and the side wall 47 (formed on the upper and lateral surfaces of the word line 12, respectively). In this way the lower layer wiring 31 is formed below the word line 12; therefore, there exist no other wirings at the same level as the word line 12. Thus, it is possible to bring the connecting hole 42 closer to the word line 12. Moreover, it can be easily formed by full-wafer etching.

With the W-plug 40 embedded in the connecting hole 42, as shown in FIG. 13C, PVD is carried out to sequentially deposit the pinned layer 60 (consisting of the barrier layer 51, the antiferromagnetic layer 52, and the ferromagnetic layer 53) and the free layer 50 (consisting of the tunnel insulating film 54, the ferromagnetic layer (memory layer) 55, and the cap layer 56) from the same materials as used in Embodiment 1-1, as shown in FIG. 13D. In this way it is possible to reduce the distance between the word line 12 and the plug 40 for connection with the reading wiring 22 mentioned later.

The P-TEOS film 38 (200 nm thick) is deposited and then it is patterned by reactive ion etching through the photoresist film 43 as the mask, as shown in FIG. 13E.

Figure 14A:
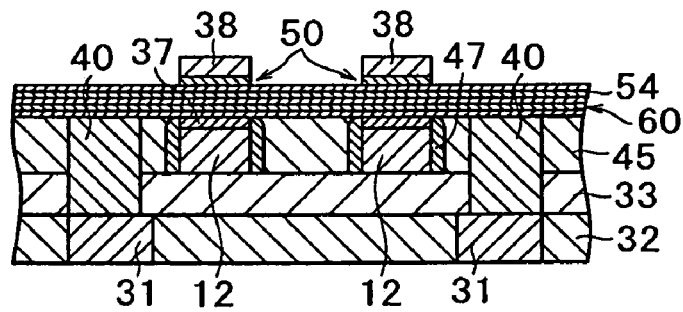
FIG. 14A to 14D is a diagram showing the process for production of MRAM according to Embodiment 2-2 of the present invention.

With the photoresist film removed, reactive ion etching is performed on the free layer 50 (consisting of the cap layer 56 and the upper ferromagnetic layer 55) through the P-TEOS film 38 as the mask, as shown in FIG. 14A. Etching should be carried out such that it terminates in the tunnel insulating film 54 after it has completely removed the upper ferromagnetic layer 55. In addition, etching should be carried out such that the P-TEOS film 38 remains more than 100 nm on the cap layer 56. The etching gas is a halogen gas containing chlorine or a carbon monoxide gas mixed with NH$_3$.

Figure 14B:
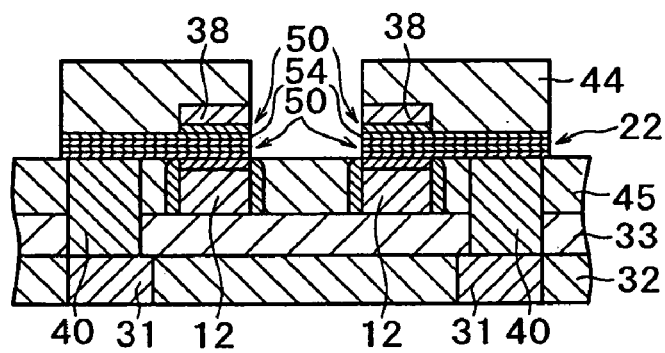

Etching is performed through the photoresist film 44 and the P-TEOS film 38 as the mask to remove the remainder of the tunnel insulating film 54 and the pinned layer 60 (which consists of the lower ferromagnetic layer 53, the underlying antiferromagnetic layer 52, and the barrier layer 51), thereby forming the wiring pattern connecting to the magnetization pinned layer and the underlying layer, as shown in FIG. 14B.

Figure 14C:
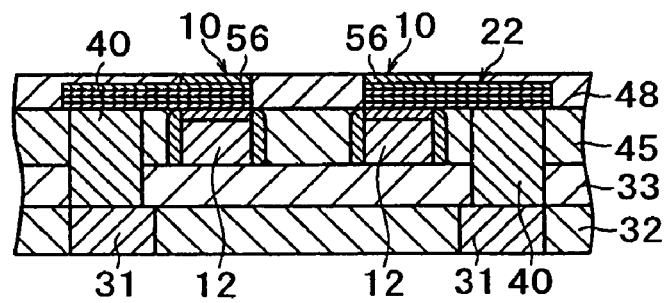

CVD or PVD is performed to deposit the insulating film 48 of SiO$_2$ or Al$_2$O$_3$ over the entire surface, as shown in FIG. 14C. CMP is performed to planarize the insulating film 48 and the P-TEOS film 38, so that the cap layer 56 (which is the uppermost layer of the TMR) is exposed. The exposed part functions as a self-aligned contact for the bit line.

Figure 14D:
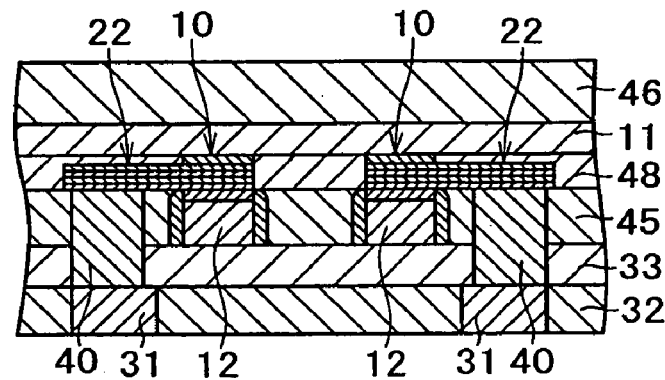

The bit line 11, the peripheral circuit wiring (not shown), and the bonding pad region (not shown) are formed by the standard wiring technology, as shown in FIG. 14D. The plasma silicon nitride film 46 is deposited over the entire surface. Finally, a hole for the bonding pad region is made. Thus, the wafer process for LSI is completed.

Embodiments 2-1 and 2-2 mentioned above offer the following advantages. The lower layer wiring 31 is formed below the word line 12. The upper surface 37 and the lateral surface 47 of the word line 12 are covered with an etch-selective material. The connecting hole 42 is formed for connection to the plug 34 formed on the lower layer wiring 31. The reading wiring 22 extends in the connecting hole 42 for direct connection to the plug 34 (in Embodiment 2-1), or the plug 40 is formed in the entire connecting hole reaching the lower layer wiring 31 and the reading wiring 22 is connected to this plug 40 (in Embodiment 2-2). Therefore, the upper and lateral surfaces of the word line 12 are covered with an etch-selective material. In either case, the word line 12 is protected with an etch-selective material when the connecting hole 42 is formed.

Consequently, there is no possibility that the word line 12 is damaged when the connecting hole 42 is formed. This permits the connecting hole 40 to be easily formed close to the word line 12. Thus, it is possible to reduce the distance between the word line 12 and the plug 40 or the reading wiring 22 formed in the connecting hole 42 more than in Embodiment 1 by extending the reading wiring 22 to the connecting hole 42 or by connecting it to the lower wiring 31 through the plug. The space between the word line 12 and the connecting hole 42 shown in FIG. 1B can be reduced to F/2 or less and the size in the direction along the bit line 11 can be reduced to 3.2F.

In other words, the structure according to Embodiment 2 differs from that according to Embodiment 1 in that the difference between the word line 12 and the plug 34 or 40 for connection to the reading wiring 22 is reduced more, because the word line 12 one layer below the TMR element 10 is covered with the P—SiN film or Al$_2$O$_3$ film having a high breakdown voltage and a high etch-selectivity for the commonly used silicon oxide interlayer film. Assuming a design rule of 0.18 μm, F will be 0.27 μm. There is no need for allowance to ensure the breakdown voltage, but it is only necessary to set aside 0.2F for overlapping allowance. Therefore, the length in the direction along the bit line is 3.2F (which corresponds to 4F in FIG. 39). It follows that the size of the memory cell is 9.6F2 (3.2F×3F in the direction intersecting with the bit line.)

Embodiment 3

Figure 15:
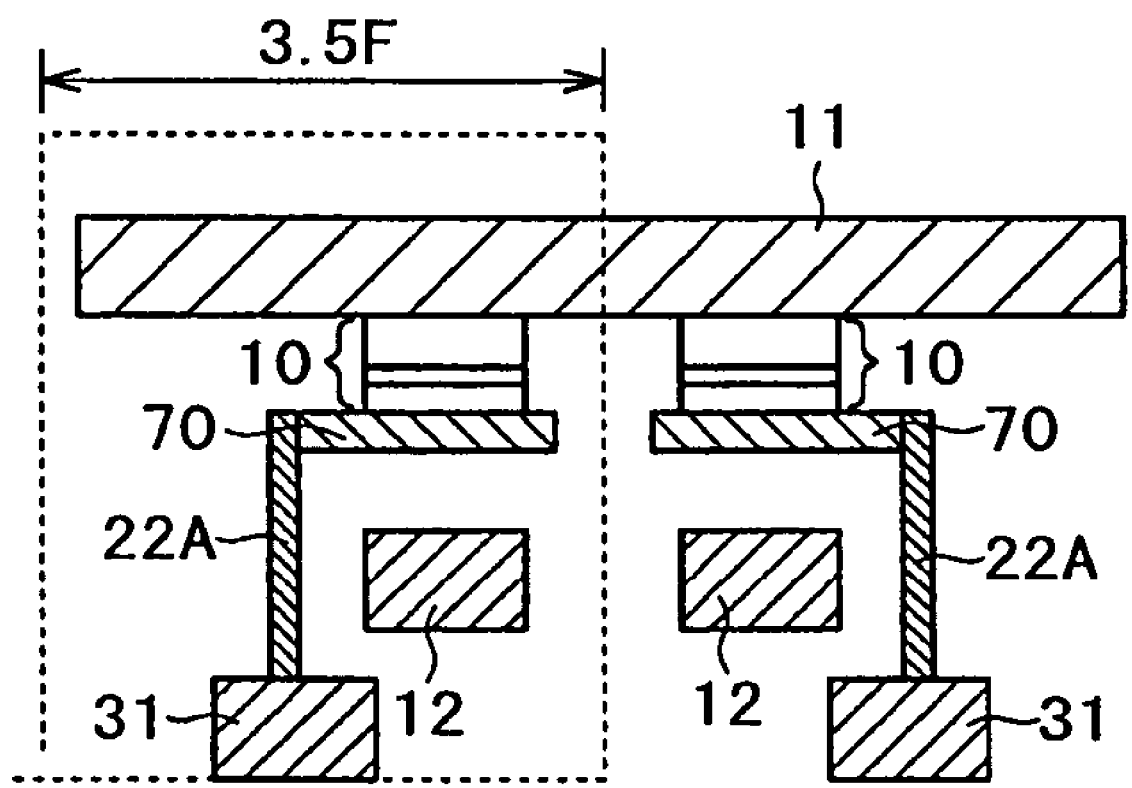
FIG. 15 is a schematic diagram showing the structure of the MRAM according to Embodiment 3 of the present invention.

FIG. 15 is a schematic diagram showing the structure of the MRAM according to this embodiment. As in the case of Embodiments 1 and 2, the MRAM is constructed such that the landing pad does not exist at the same level as the word line 12, and the reading wiring is connected to the lower layer wiring 31 through the local wiring 22A connected to the conducting layer 70 under the TMR element 10. Since the local wiring 22A needs only a small area, the distance corresponding to that indicated by 4F in FIG. 39 is reduced to 3.5F, as in the case of Embodiment 1.

Embodiment 3-1

The production process will be described with reference to FIGS. 16 to 19.

Figure 16A:
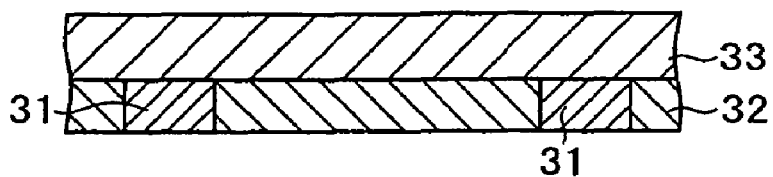
FIG. 16A to 16F is a diagram showing the process for production of MRAM according to Embodiment 3-1 of the present invention.
Figure 16B:
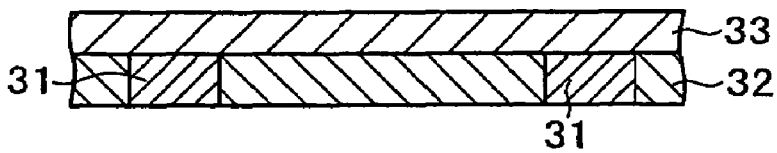

On the lower layer wiring 31 (600 nm thick) are sequentially deposited the HDP film 32 (800 nm thick) and the P-TEOS film 33 (1200 nm thick), as shown in FIG. 16A. Then, CMP is performed such that an insulting film (700 nm thick) is left on the lower layer wiring 31, as shown in FIG. 16B.

Figure 16C:
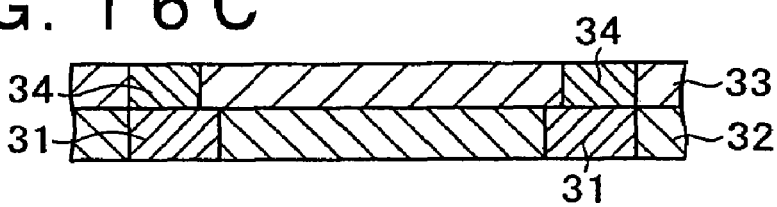

A connecting hole (not shown) for electrical connection to the lower layer wiring 31 is formed by lithography and etching. In this hole is formed the W-plug 34 by W-CVD and ensuing CMP, as shown in FIG. 16C.

Figure 16D:
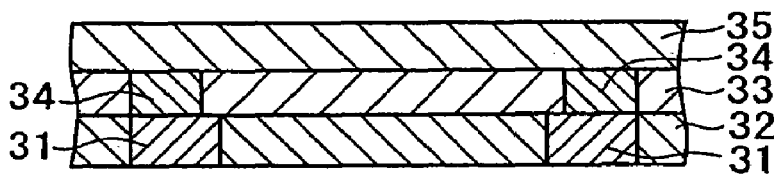
Figure 16E:
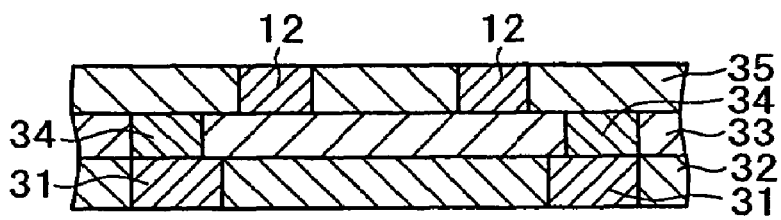
Figure 16F:
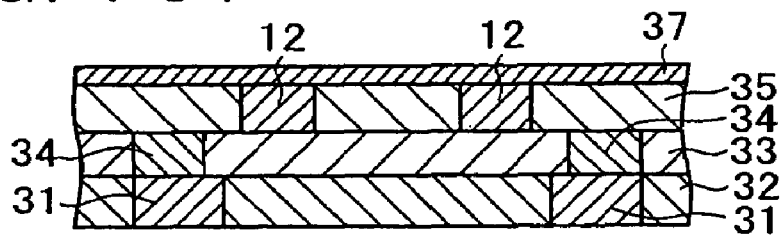

The P—SiN film (50 nm thick) (not shown) and the P-TEOS film 35 (400 nm thick) are deposited sequentially, as shown in FIG. 16D. Etching through the photoresist film (not shown) as the mask is performed on the P-TEOS film 35 and then etching is performed on the P—SiN film to form the wiring groove (not shown). In this wiring groove are sequentially deposited the Ta/TaN/Cu seed layers (not shown) by sputtering. The wiring groove is filled by Cu plating. CMP is performed to planarize the surface of the wiring groove to form the word line 12, as shown in FIG. 16E. The P—SiN film 37 (50 nm thick) is deposited, as shown in FIG. 16F. In this way the lower layer wiring 31 is formed at the lower level than the word line 12.

Figure 17A:
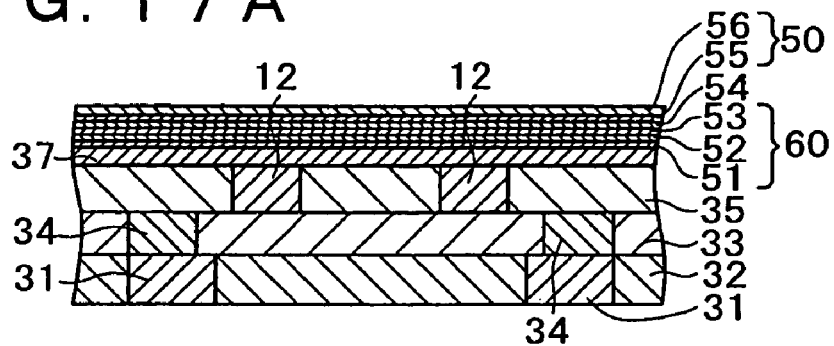
FIG. 17A to 17D is a diagram showing the process for production of MRAM according to Embodiment 3-1 of the present invention.

PVD is carried out to sequentially form the pinned layer 60 (consisting of the barrier layer 51, the antiferromagnetic layer 52, and the ferromagnetic layer 53) and the free layer 50 (consisting of the tunnel insulating film 54, the ferromagnetic layer (memory layer) 55, and the cap layer 56) from the same materials as used in Embodiment 1, as shown in FIG. 17A.

Figure 17B:
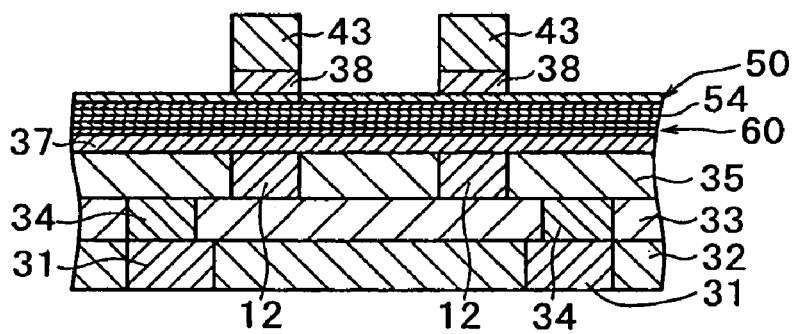

The P-TEOS film 38 (200 nm thick) is deposited and then it is patterned by reactive ion etching through the photoresist film 43 as the mask, as shown in FIG. 17B. This P-TEOS film 38 functions as the etch-selective film that covers the upper surface of the TMR element.

Figure 17C:
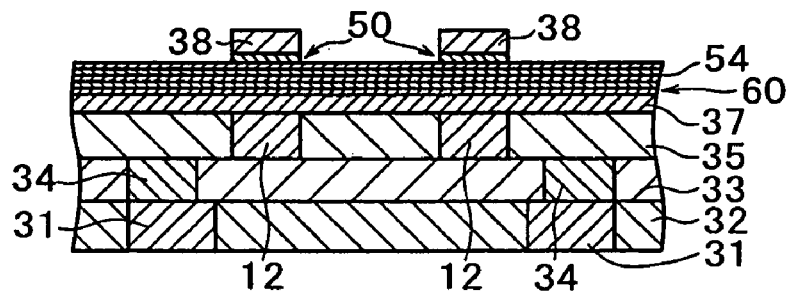

With the photoresist film removed, reactive ion etching is performed on the free layer 50 (consisting of the cap layer 56 and the upper ferromagnetic layer 55) through the P-TEOS film 38 as the mask, as shown in FIG. 17C. Etching should be carried out such that it terminates in the tunnel insulating film 54 after it has completely removed the upper ferromagnetic layer 55. In addition, etching should be carried out such that the P-TEOS film 38 remains more than 100 nm on the cap layer 56 and the memory layer 55. The etching gas is a halogen gas containing chlorine or a carbon monoxide gas mixed with NH$_3$.

Figure 17D:
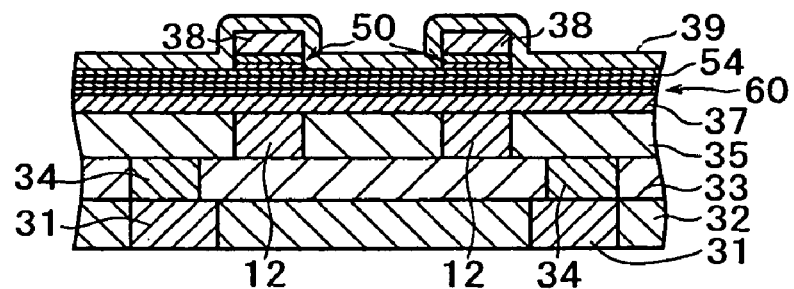
Figure 18A:
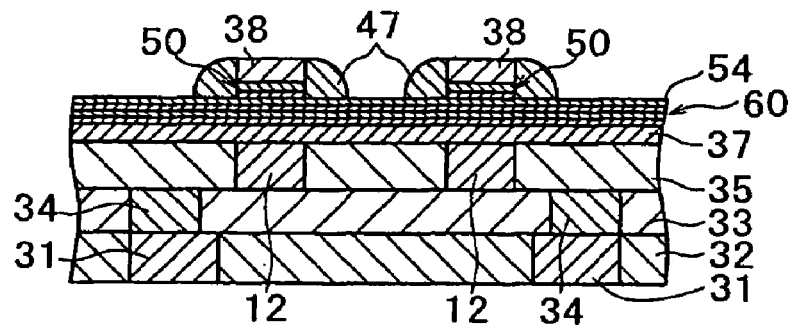
FIG. 18A to 18D is a diagram showing the process for production of MRAM according to Embodiment 3-1 of the present invention.

The P-TEOS film 39 (200 nm thick) is deposited over the entire upper surface, as shown in FIG. 17D. Etch-back is performed on it to form the side wall 47 as the etching mask on the lateral surface of the free layer 50, as shown in FIG. 18A.

Figure 18B:
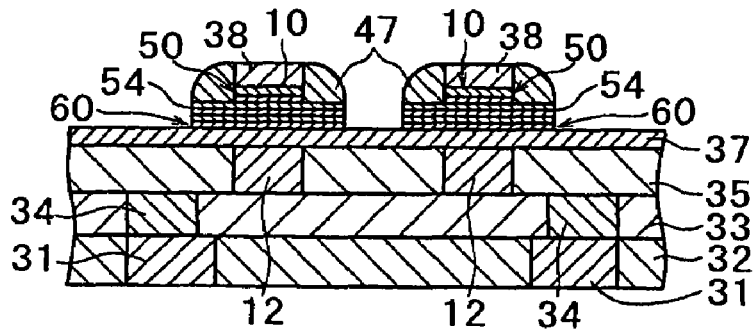

The tunnel insulating film 54 and the pinned layer 60 are removed by reactive ion etching that employs as the mask the upper P-TEOS film 38 covering the free layer 50 and the side wall 39 of P-TEOS, as shown in FIG. 18B. The etching gas is a halogen gas containing chlorine or a carbon monoxide gas mixed with $NH_3$.

Figure 18C:
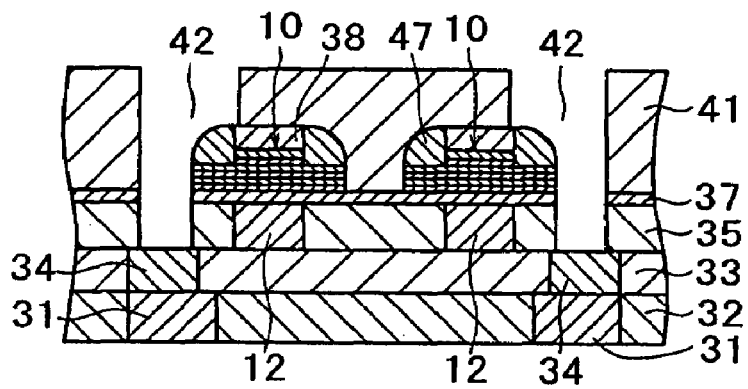

The photoresist mask 41 is formed and the connecting hole 42 reaching the plug 34 is formed, as shown in FIG. 18C. The photoresist mask 41 is formed such that the P-TEOS film 38 and the side wall 39 are partly exposed. The P—SiN film 37 and the P-TEOS film 35 which are covered by the P-TEOS film 38 and the side wall 39 remain unetched. In this way the word line 12 is completely protected and the connecting hole 42 is formed close to the word line 12. Moreover, it can be easily formed by full-wafer etching.

Figure 18D:
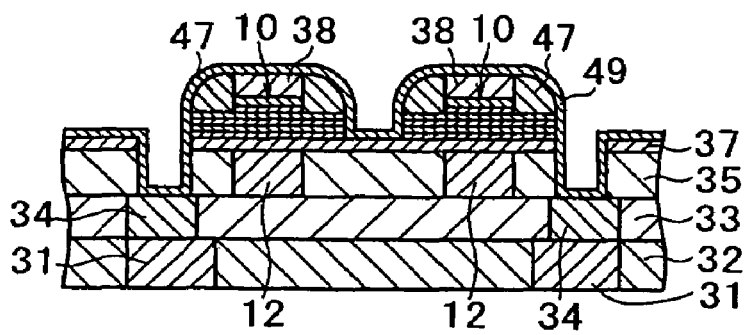
Figure 19A:
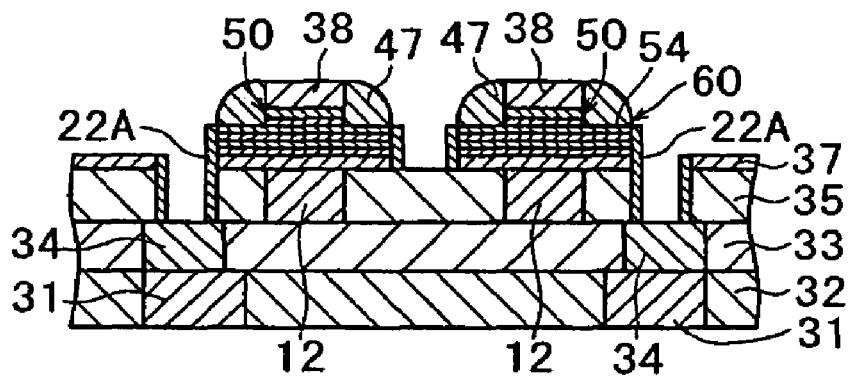
FIG. 19A to 19C is a diagram showing the process for production of MRAM according to Embodiment 3-1 of the present invention.

With the resist mask 41 removed, the Cu film 49 is formed by sputtering over the entire upper surface, as shown in FIG. 18D. Etch-back is performed on the Cu film 49 so as to remove the upper Cu film, as shown in FIG. 19A. The tunnel insulating film 54, the lateral surface of the pinned layer 60, and the side wall surface of the connecting hole 42 remain. The local wiring 22A is formed from the Cu film which has remained, extending from the tunnel insulating film 54 and the one side of the pinned layer 60 to one of the side wall surfaces of the connecting hole 42. The distance between the word line 12 and the local wiring 22A can be reduced.

Figure 19B:
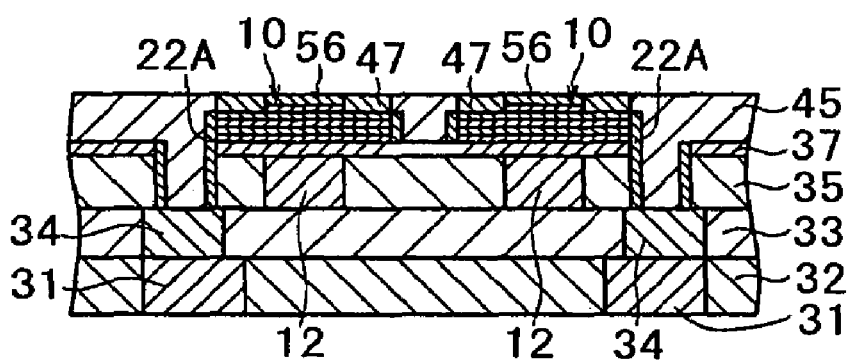

CVD or PVD is performed to deposit the insulating film 45 of $SiO_2$ or $Al_2O_3$ over the entire surface, and CMP is performed to planarize and polish the insulating film 45 and the P-TEOS film 38, so that the cap layer 56 (which is the uppermost layer of the TMR) is exposed, as shown in FIG. 19B. The exposed part functions as a self-aligned contact for the bit line.

Figure 19C:
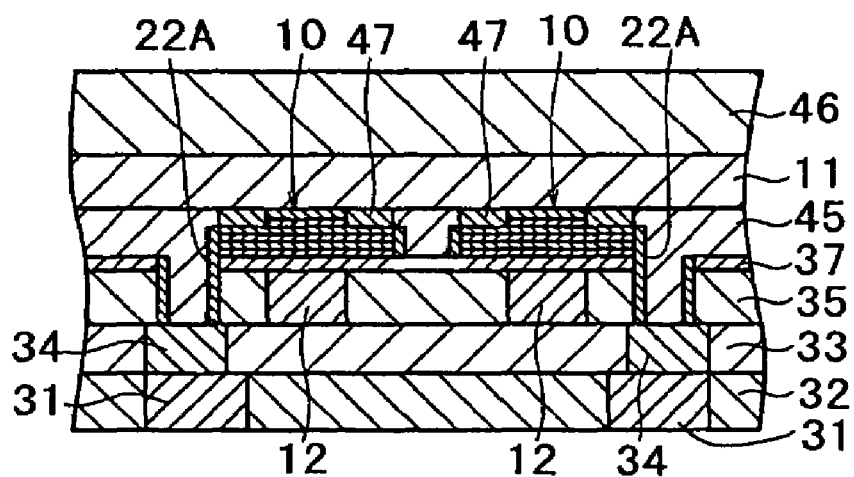

The bit line 11, the peripheral circuit wiring (not shown), and the bonding pad region (not shown) are formed by the standard wiring technology, as shown in FIG. 19C. The plasma silicon nitride film 46 is deposited over the entire surface. Finally, a hole for the bonding pad region is made. Thus, the wafer process for LSI is completed.

Embodiment 3-2

The production process will be described with reference to FIGS. 20 to 23.

Figure 20A:
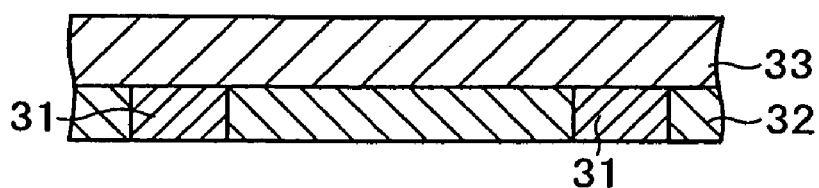
FIG. 20A to 20E is a diagram showing the process for production of MRAM according to Embodiment 3-2 of the present invention.
Figure 20B:
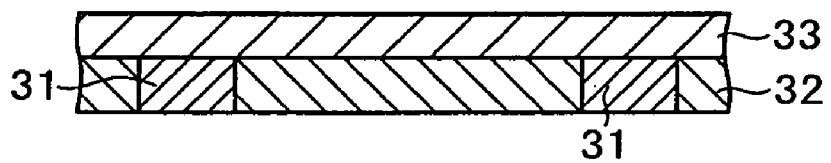

On the lower layer metal wiring 31 (600 nm thick) are sequentially deposited the HDP film 32 (800 nm thick) and the P-TEOS film 33 (1200 nm thick), as shown in FIG. 20A. Then, CMP is performed such that an insulting film (700 nm thick) is left on the metal wiring 31, as shown in FIG. 20B.

Figure 20C:
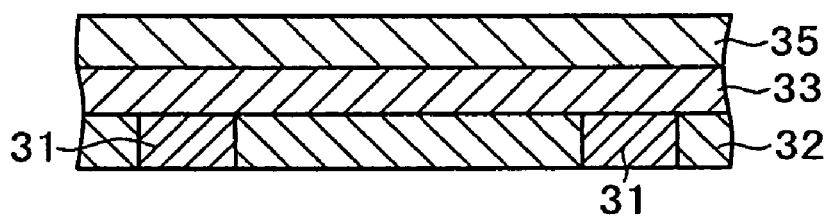
Figure 20D:
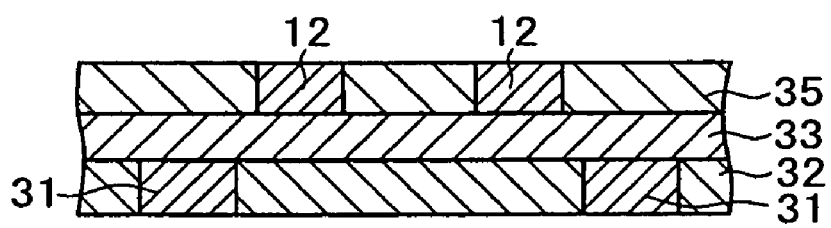
Figure 20E:
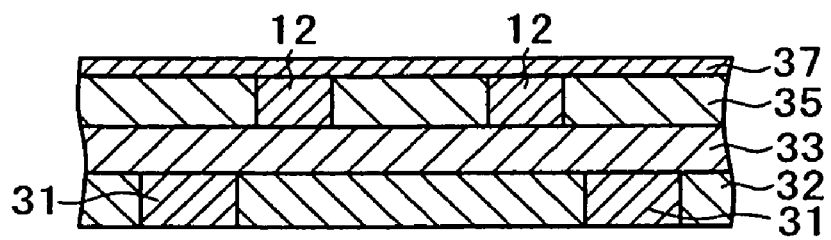

The P—SiN film (50 nm thick) (not shown) and the P-TEOS film 35 (400 nm thick) are deposited sequentially, as shown in FIG. 20C. Etching through the photoresist film (not shown) as the mask is performed on the P-TEOS 35 and then etching is performed on the P—SiN film to form the wiring groove (not shown). In this wiring groove are sequentially deposited the Ta/TaN/Cu seed layers (not shown) by sputtering. The wiring groove is filled by Cu plating. CMP is performed to planarize the surface of the wiring groove to form the word line 12, as shown in FIG. 20D. The P—SiN film 37 (50 nm thick) is deposited, as shown in FIG. 20E. In this way the lower layer wiring 31 is formed at the lower level than the word line 12.

Figure 21A:
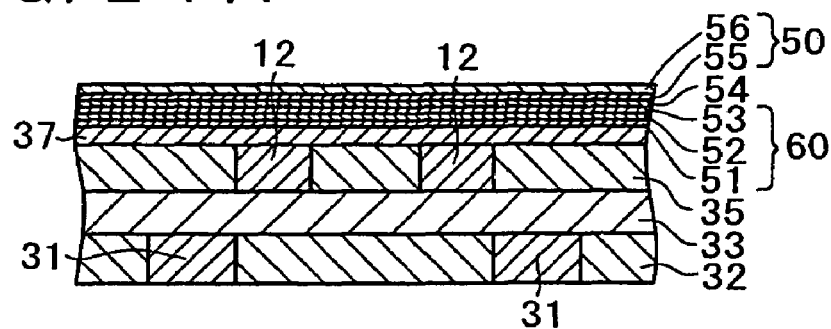
FIG. 21A to 21D is a diagram showing the process for production of MRAM according to Embodiment 3-2 of the present invention.

PVD is carried out to sequentially form the pinned layer 60 (consisting of the barrier layer 51, the antiferromagnetic layer 52, and the ferromagnetic layer 53) and the free layer 50 (consisting of the tunnel insulating film 54, the ferromagnetic layer (memory layer) 55, and the cap layer 56) from the same materials as used in Embodiment 1, as shown in FIG. 21A.

Figure 21B:
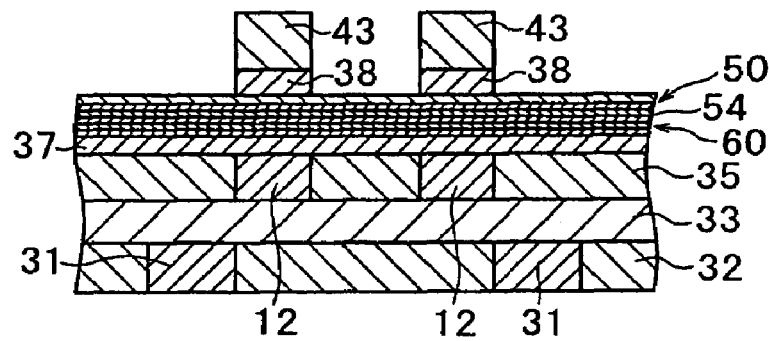

The P-TEOS film 38 (200 nm thick) is deposited and then it is patterned by reactive ion etching through the photoresist film 43 as the mask, as shown in FIG. 21B. This P-TEOS film 38 functions as the etch-selective film that covers the upper surface of the TMR element.

Figure 21C:
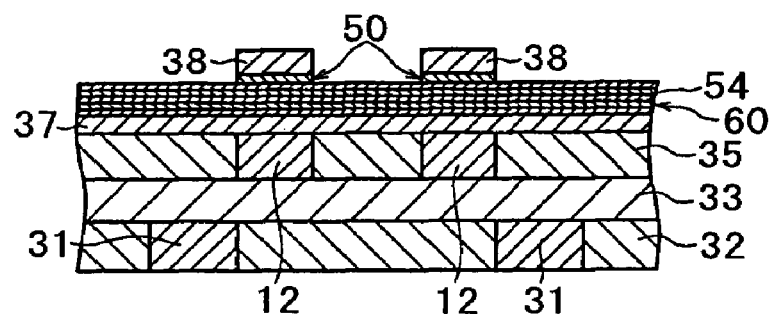

With the photoresist film removed, reactive ion etching is performed on the free layer 50 (consisting of the cap layer 56 and the upper ferromagnetic layer 55) through the P-TEOS film 38 as the mask, as shown in FIG. 21C. Etching should be carried out such that it terminates in the tunnel insulating film 54 after it has completely removed the upper ferromagnetic layer 55. In addition, etching should be carried out such that the P-TEOS film 38 remains more than 100 nm on the cap layer 56 and the memory layer 55. The etching gas is a halogen gas containing chlorine or a carbon monoxide gas mixed with $NH_3$.

Figure 21D:
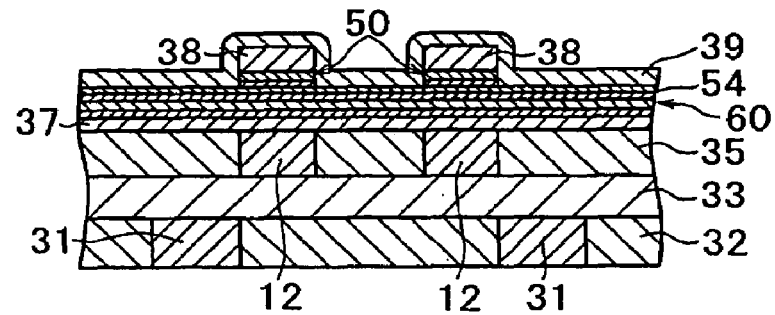
Figure 22A:
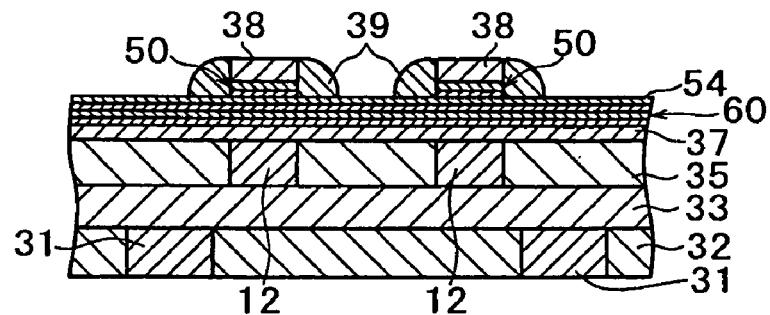
FIG. 22A to 22D is a diagram showing the process for production of MRAM according to Embodiment 3-2 of the present invention.

The P-TEOS film 39 (200 nm thick) is deposited over the entire upper surface, as shown in FIG. 21D. Etch-back is performed on it to form the side wall 47 (as the etching mask) on the lateral surface of the free layer 50, as shown in FIG. 22A.

Figure 22B:
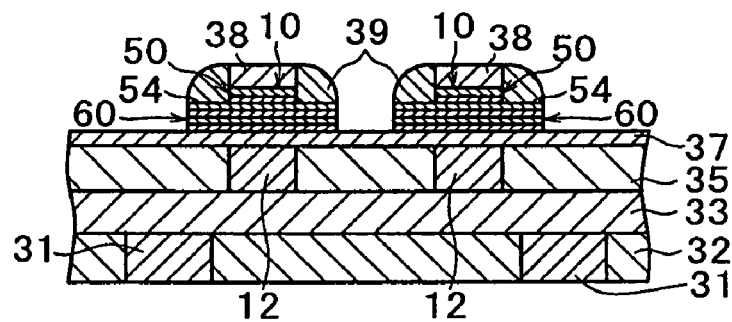

The tunnel insulating film 54 and the pinned layer 60 are removed by reactive ion etching that employs as the mask the upper P-TEOS film 38 covering the free layer 50 and the side wall 39 of P-TEOS, as shown in FIG. 22B. The etching gas is a halogen gas containing chlorine or a carbon monoxide gas mixed with $NH_3$.

Figure 22C:
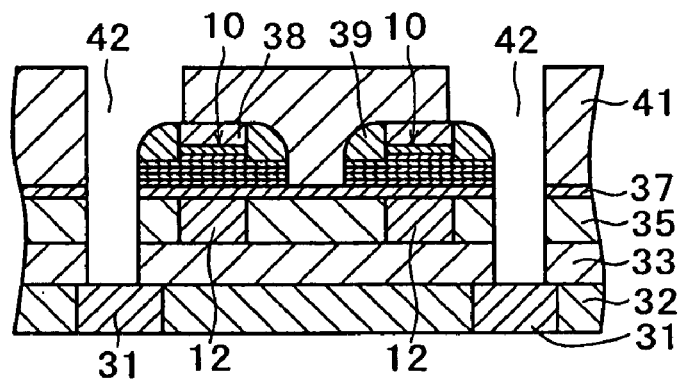

The photoresist mask 41 is formed and the connecting hole 42 reaching the lower wiring 31 is formed, as shown in FIG. 22C. The photoresist mask 41 is formed such that the P-TEOS film 38 and the side wall 39 are partly exposed. The P—SiN film 37 and the P-TEOS film 35 which are covered by the P-TEOS film 38 and the side wall 39 remain unetched. In this way the word line 12 is completely protected and the connecting hole 42 is formed close to the word line 12. Moreover, it can be easily formed by full-wafer etching.

Figure 22D:
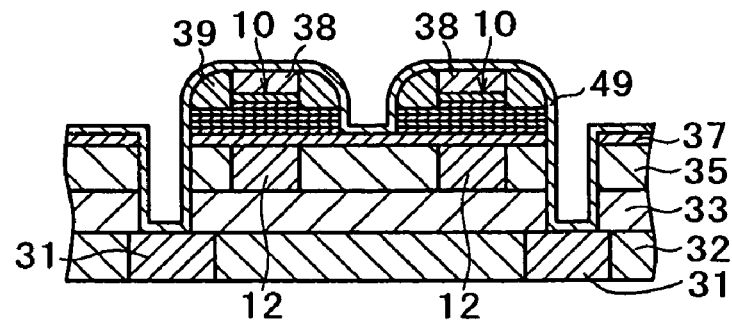
Figure 23A:
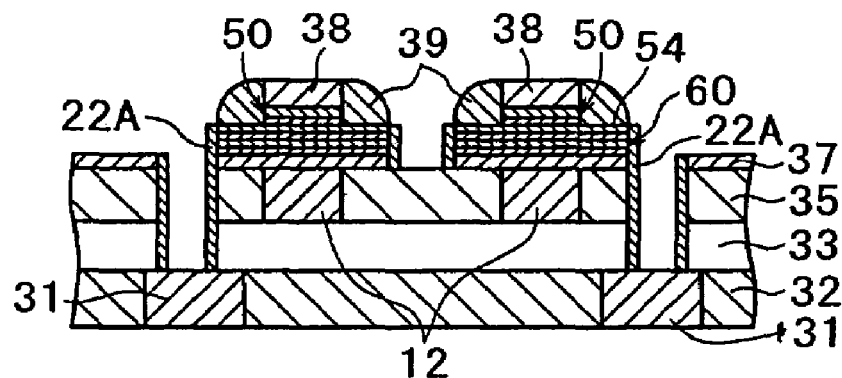
FIG. 23A to 23C is a diagram showing the process for production of MRAM according to Embodiment 3-2 of the present invention.

With the resist mask 41 removed, the Cu film 49 is formed by sputtering over the entire upper surface, as shown in FIG. 22D. Etch-back is performed on the Cu film 49 so as to remove the upper Cu film, as shown in FIG. 23A. The Cu film remains on the tunnel insulating film 54, the lateral surface of the pinned layer 60, and the side wall surface of the connecting hole 42. The local wiring 22A is formed from the Cu film which has remained, extending from the tunnel insulating film 54 and the one side of the pinned layer 60 to one of the side wall surfaces of the connecting hole 42. The distance between the word line 12 and the local wiring 22A can be reduced.

Figure 23B:
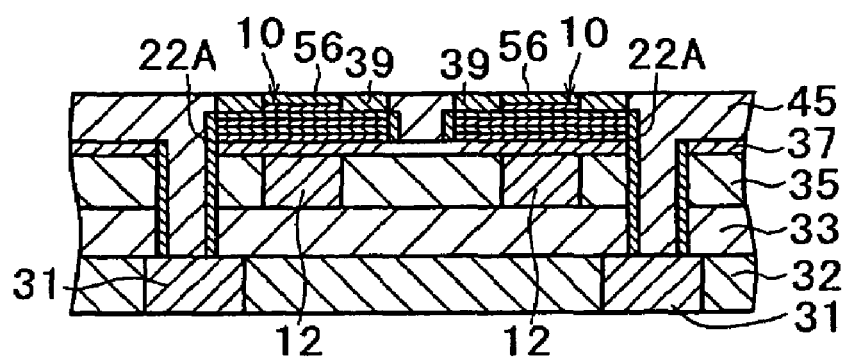

CVD or PVD is performed to deposit the insulating film 45 of $SiO_2$ or $Al_2O_3$ over the entire surface, and CMP is performed to planarize and polish the insulating film 45 and the P-TEOS film 38, so that the cap layer 56 (which is the uppermost layer of the TMR) is exposed, as shown in FIG. 23B. The exposed part functions as a self-aligned contact for the bit line.

Figure 23C:
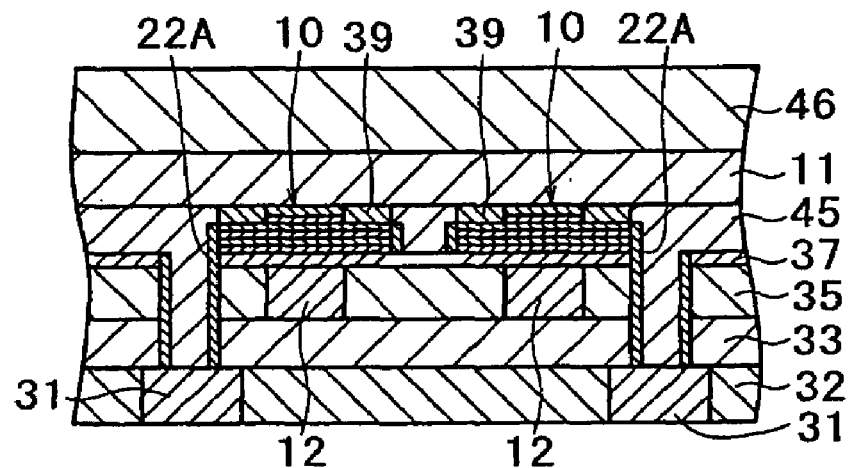

The bit line 11, the peripheral circuit wiring (not shown), and the bonding pad region (not shown) are formed by the standard wiring technology, as shown in FIG. 23C. The plasma silicon nitride film 46 is deposited over the entire surface. Finally, a hole for the bonding pad region is made. Thus, the wafer process for LSI is completed.

Embodiment 3 mentioned above offers the following advantages. The lower layer wiring 31 is formed below the word line 12. The upper surface 38 and the lateral surface 39 of the free layer 50 of the TMR element 10 covered with a mask of etch-selective material. By using this mask and the resist mask 41 as the mask, the connecting hole 42 for connection to the plug 34 formed on the lower layer wiring 31 is formed (in Embodiment 3-1) or the connecting hole 42 reaching the lower layer wiring 31 is formed (in Embodiment 3-2). The reading wiring is formed with the local wiring 22A extending from the tunnel insulating film 54 and the lateral surface of the pinned layer 60 to the side wall surface of the connecting hole 42, and it is connected to the lower layer wiring 31 directly or through the plug 34.

However, since the upper surface and the lateral surface of the free layer 50 of the TMR element 10 are covered with an etch-selective mask, it is possible to surely protect the word line 12 existing below this mask when the connecting hole 42 is formed, and the connecting hole 42 can be easily formed close to the word line 12. Therefore, it is possible to easily form the memory cell in which the distance between the word line 12 and the local wiring 22A is reduced as in Embodiment 1.

As the result, the MRAM region in the direction along the bit line can be reduced, by 0.5F, to 3.5F (4F−0.5F) as in Embodiment 1, and the memory size can be reduced to 10.5F2 (3.5F in the direction along the bit line×3F in the direction intersecting with the bit line). This result should be compared with the MRAM of conventional structure in which the region in the direction along the bit line is 4F, as shown in FIG. 39.

Embodiment 4

Figure 24:
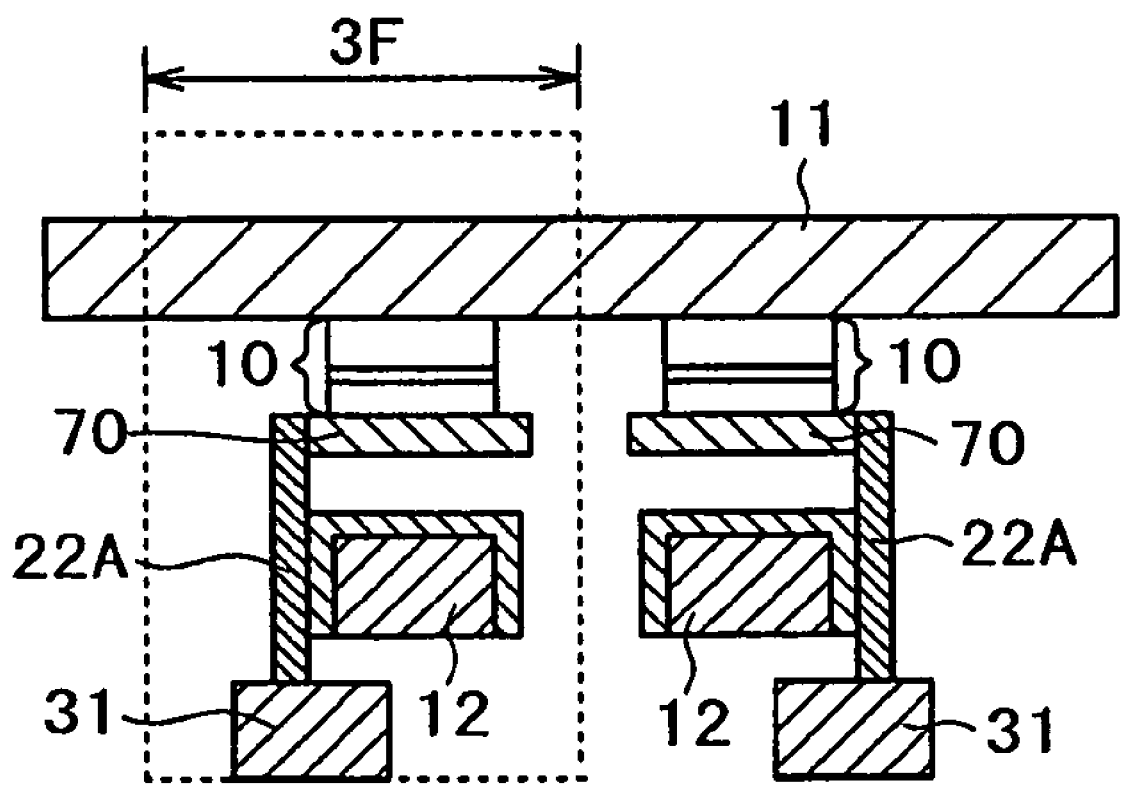
FIG. 24 is a schematic diagram showing the structure of the MRAM according to Embodiment 4 of the present invention.

FIG. 24 is a schematic diagram showing the structure of the MRAM according to this embodiment. As in the case of the above-mentioned embodiments, the MRAM is constructed such that the landing pad does not exist at the same level as the word line 12, and the reading wiring is connected to the lower layer wiring 31 through the local wiring 22A connected to the conducting layer 70 under the TMR element 10. Moreover, the MRAM is constructed such that the upper and lateral surfaces of the word line 12 are covered with an etch-selective material, so that the connecting hole 42 is formed closer to the word line 12. Thus, the distance between the word line 12 and the local wiring 22A is reduced further and the size of the MRAM in the direction along the bit line is reduced to 3F (which corresponds to 4F in FIG. 39).

Embodiment 4-1

The production process will be described with reference to FIGS. 25 to 28.

Figure 25A:
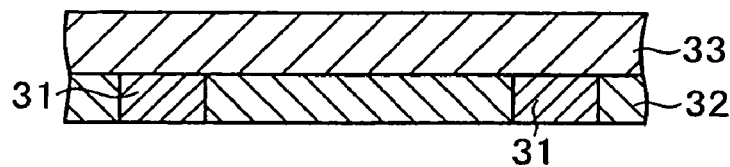
FIG. 25A to 25F is a diagram showing the process for production of MRAM according to Embodiment 4-1 of the present invention.
Figure 25B:
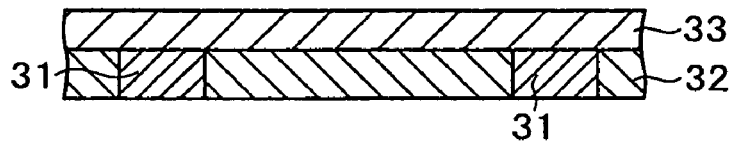

On the lower layer wiring 31 (600 nm thick) are sequentially deposited the HDP film 32 (800 nm thick) and the P-TEOS film 33 (1200 nm thick), as shown in FIG. 25A. Then, CMP is performed such that an insulting film (700 nm thick) is left on the lower layer wiring 31, as shown in FIG. 25B.

Figure 25C:
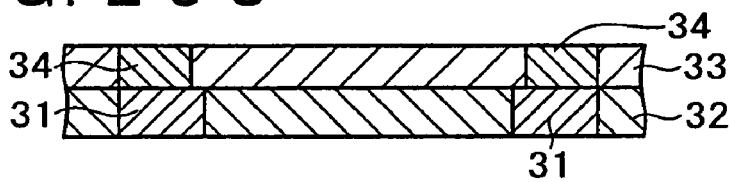

A connecting hole (not shown) for electrical connection to the lower layer wiring 31 is formed by lithography and etching. In this hole is formed the W-plug 34 by W-CVD and ensuing CMP, as shown in FIG. 25C.

Figure 25D:
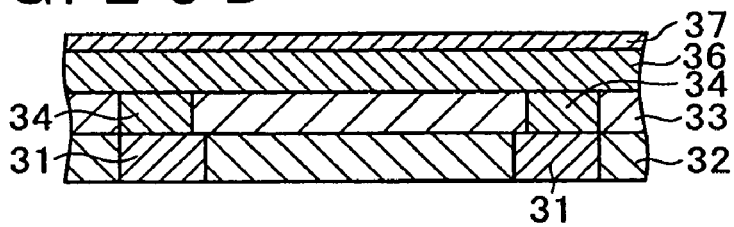
Figure 25E:
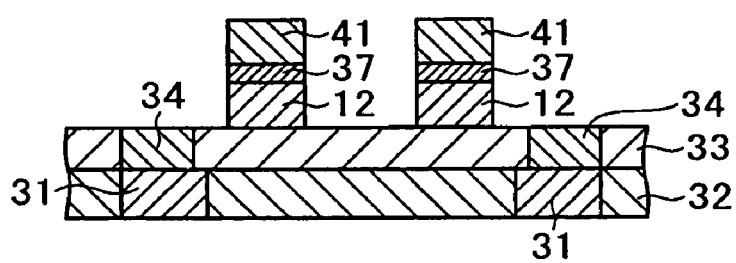

The metal multi-layer film 36 (such as Ti/TiN/Al-0.5% Cu=10/30/700 nm) is deposited by sputtering, and then the P—SiN film 37 (100 nm thick) is deposited, as shown in FIG. 25D. Etching though the photoresist film 41 as the mask is performed on the P—SiN film 37 and the metal multi-layer film 36 in order to form the word line 12, as shown in FIG. 25E. In this way, the lower layer wiring 31 is formed below the word line 12.

Figure 25F:
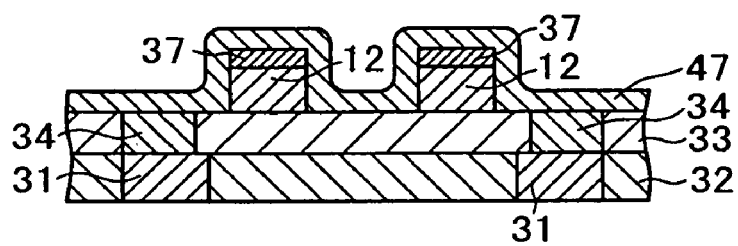
Figure 26A:
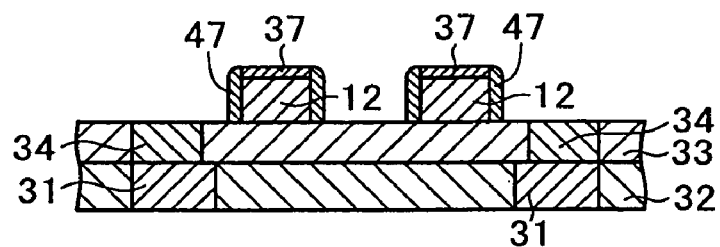
FIG. 26A to 26E is a diagram showing the process for production of MRAM according to Embodiment 4-1 of the present invention.

The P—SiN film 47 (50 nm thick) is deposited and etch-back is performed on it, as shown in FIG. 25F. This step forms the side wall 47 of P—SiN on the lateral surface of the word line 12, as shown in FIG. 26A. The amount of overetching should be set up so that the P—SiN film 37 remains more than 70 nm on the word line 12.

Figure 26B:
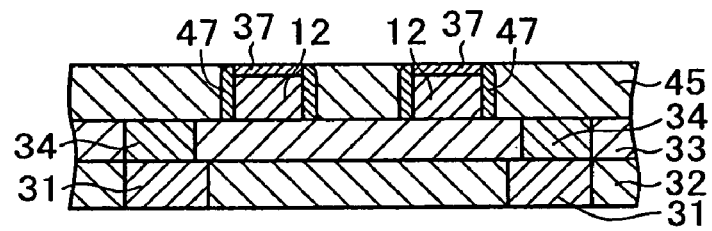

CVD or PVD is performed to deposit the insulating film 45 of $SiO_2$ or $Al_2O_3$ over the entire surface, and CMP is performed to planarize and polish the insulating film 45, so that P—SiN film 37 is exposed, as shown in FIG. 26B.

Figure 26C:
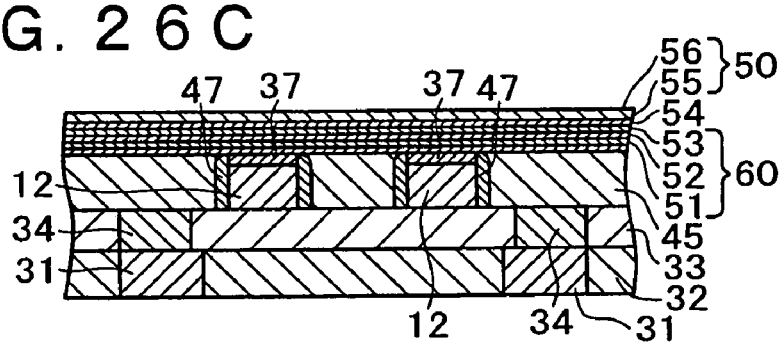

PVD is carried out to sequentially form the pinned layer 60 (consisting of the barrier layer 51, the antiferromagnetic layer 52, and the ferromagnetic layer 53) and the free layer 50 (consisting of the tunnel insulating film 54, the ferromagnetic layer (memory layer) 55, and the cap layer 56) from the same materials as used in Embodiment 1, as shown in FIG. 26C.

Figure 26D:
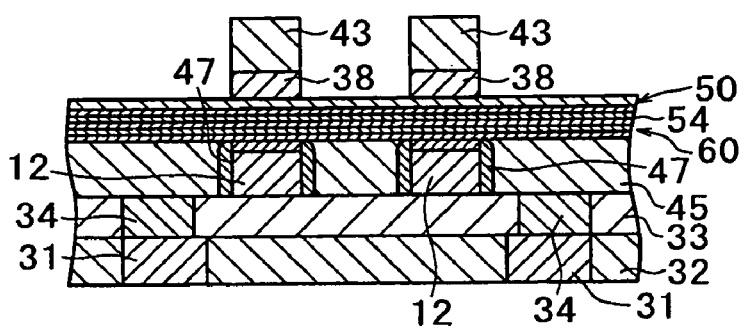

The P-TEOS film 38 (200 nm thick) is deposited and then it is patterned by reactive ion etching through the photoresist film 43 as the mask, as shown in FIG. 26D. This P-TEOS film 38 functions as the etch-selective film that covers the upper surface of the TMR element.

Figure 26E:
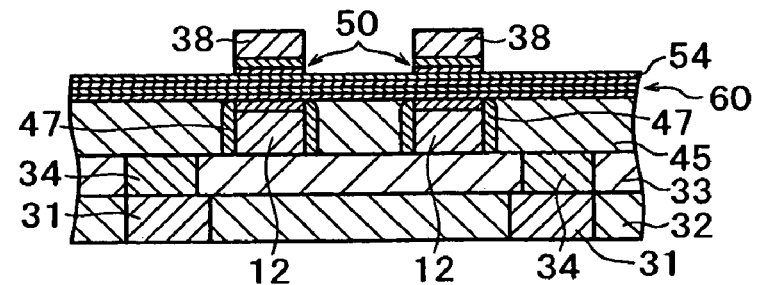

With the photoresist film removed, reactive ion etching is performed on the free layer 50 (consisting of the cap layer 56 and the upper ferromagnetic layer 55) through the P-TEOS film 38 as the mask, as shown in FIG. 26E. Etching should be carried out such that it terminates in the tunnel insulating film 54 after it has completely removed the upper ferromagnetic layer 55. In addition, etching should be carried out such that the P-TEOS film 38 remains more than 100 nm on the cap layer 56 and the memory layer 55. The etching gas is a halogen gas containing chlorine or a carbon monoxide gas mixed with $NH_3$.

Figure 27A:
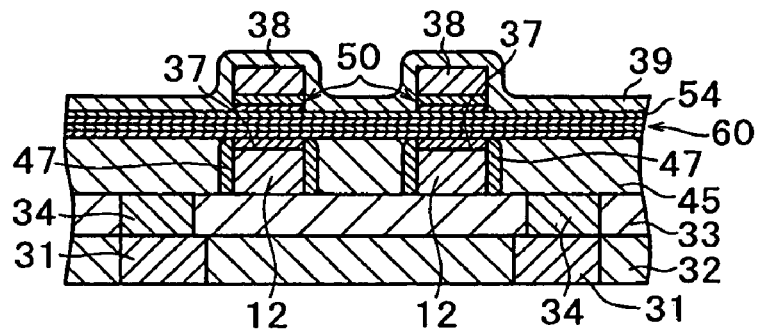
FIG. 27A to 27D is a diagram showing the process for production of MRAM according to Embodiment 4-1 of the present invention.
Figure 27B:
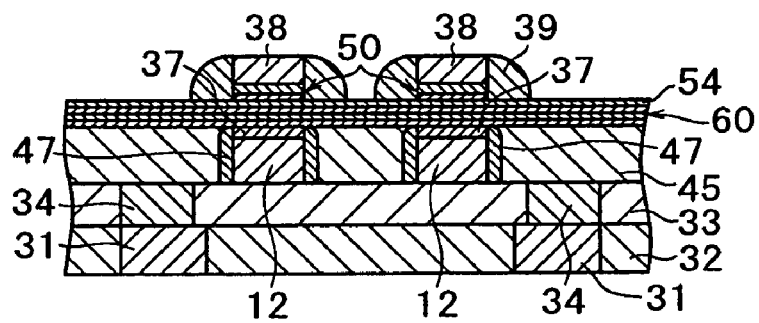

The P-TEOS film 39 (200 nm thick) is deposited over the entire upper surface, as shown in FIG. 27A. Etch-back is performed on it to form the side wall 39 (as the etching mask) on the lateral surface of the free layer 50, as shown in FIG. 27B.

Figure 27C:
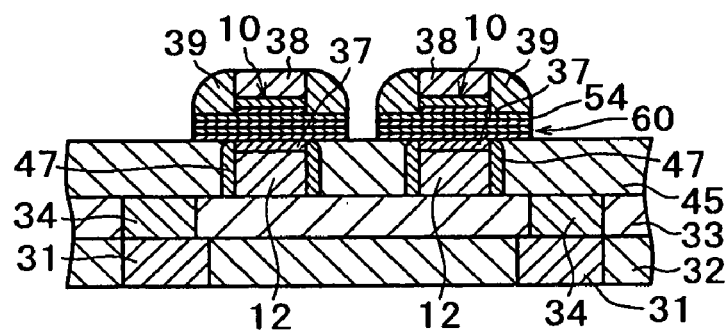

The tunnel insulating film 54 and the pinned layer 60 are removed by reactive ion etching that employs as the mask the upper P-TEOS film 38 covering the free layer 50 and the side wall 39 of P-TEOS, as shown in FIG. 27C. The etching gas is a halogen gas containing chlorine or a carbon monoxide gas mixed with $NH_3$.

Figure 27D:
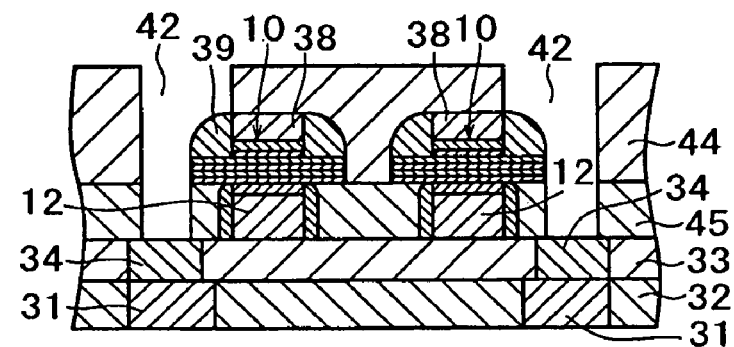

The photoresist mask 41 is formed and the connecting hole 42 reaching the plug 34 formed in the lower layer wiring 31 is made, as shown in FIG. 27D. The photoresist mask 41 is formed such that the P-TEOS film 38 and the side wall 39 are partly exposed. The word line 12 existing below the TMR element 10 has its upper and lateral sides surrounded by an etch-selective material, and the insulating film 45 which has its top covered with the P-TEOS film 38 and the side wall 39 remains unetched when the connecting hole 42 is made. Consequently, the word line 12 is protected more safely and the connecting hole 42 is formed close to the word line 12 easily by full-wafer etching. Thus, it is possible to reduce further the distance between the word line 12 and the local wiring (mentioned later) to be formed in the connecting hole 42.

Figure 28A:
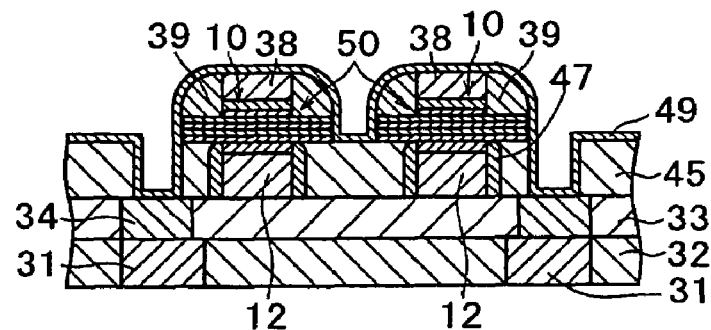
FIG. 28A to 28D is a diagram showing the process for production of MRAM according to Embodiment 4-1 of the present invention.
Figure 28B:
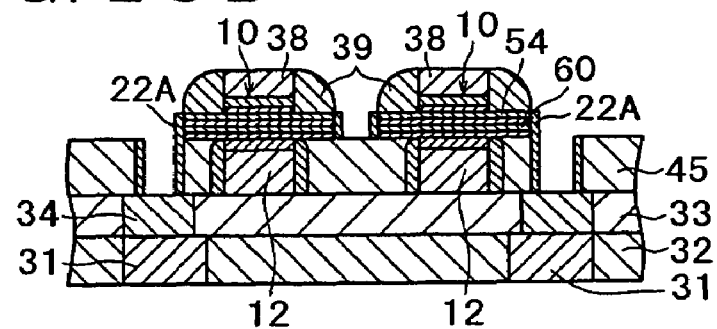

With the resist mask 41 removed, the Cu film 49 is formed by sputtering over the entire upper surface, as shown in FIG. 28A. Etch-back is performed on the Cu film 49 so as to remove the upper Cu film, as shown in FIG. 28B. The Cu film remains on the tunnel insulating film 54, the lateral surface of the pinned layer 60, and the side wall surface of the connecting hole 42. The local wiring 22A is formed from the Cu film which has remained, extending to one of the side wall surfaces of the connecting hole 42.

Figure 28C:
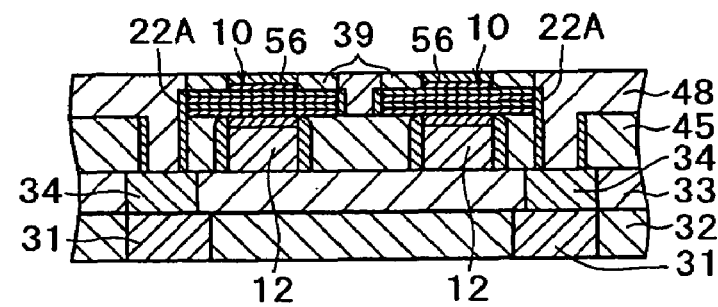

CVD or PVD is performed to deposit the insulating film 48 of $SiO_2$ or $Al_2O_3$ over the entire surface, and CMP is performed to planarize and polish the insulating film 48 and the P-TEOS film 38, so that the cap layer 56 (which is the uppermost layer of the TMR) is exposed, as shown in FIG. 28C. The exposed part functions as a self-aligned contact for the bit line.

Figure 28D:
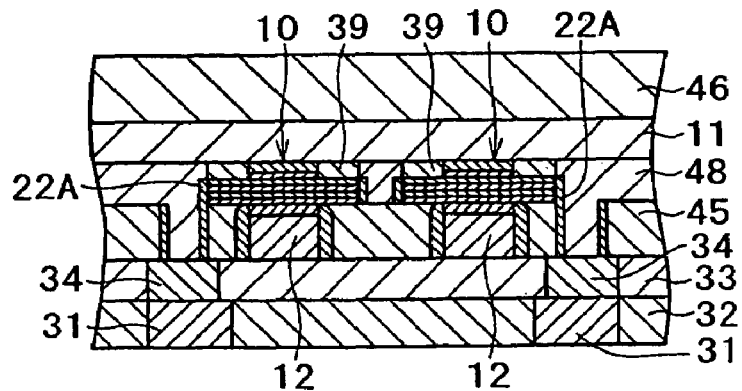

The bit line 11, the peripheral circuit wiring (not shown), and the bonding pad region (not shown) are formed by the standard wiring technology, as shown in FIG. 28D. The plasma silicon nitride film 46 is deposited over the entire surface. Finally, a hole for the bonding pad region is made. Thus, the wafer process for LSI is completed.

Embodiment 4-2

The production process will be described with reference to FIGS. 29 to 32.

Figure 29A:
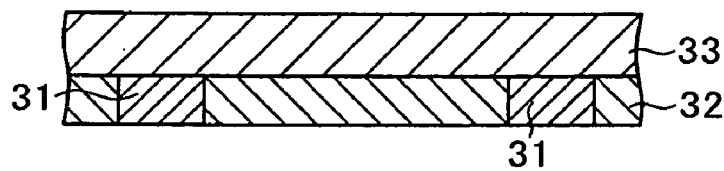
FIG. 29A to 29F is a diagram showing the process for production of MRAM according to Embodiment 4-2 of the present invention.
Figure 29B:
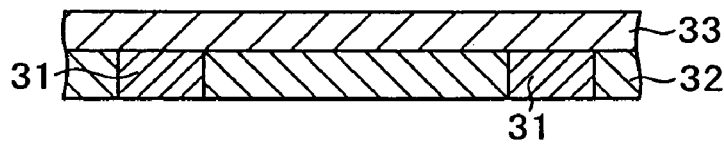

On the lower layer wiring 31 (600 nm thick) are sequentially deposited the HDP film 32 (800 nm thick) and the P-TEOS film 33 (1200 nm thick), as shown in FIG. 29A. Then, CMP is performed such that an insulting film (700 nm thick) is left on the lower layer wiring 31, as shown in FIG. 29B.

Figure 29C:
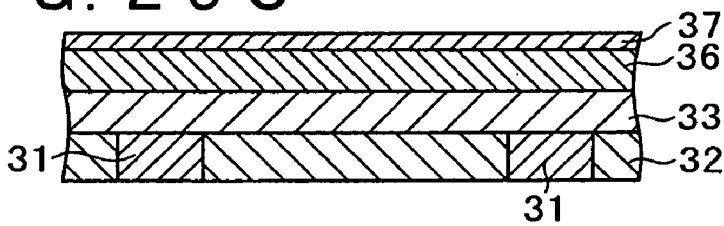
Figure 29D:
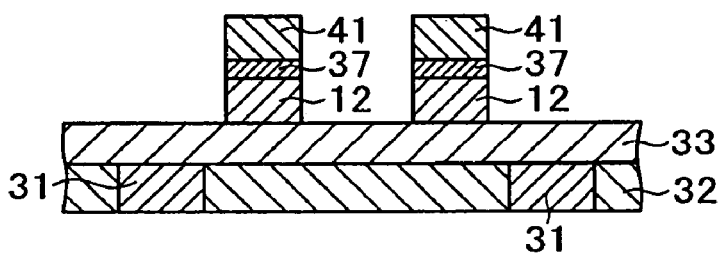

The metal multi-layer film 36 (such as Ti/TiN/Al-0.5% Cu=10/30/700 nm) is deposited by sputtering, and then the P—SiN film 37 (100 nm thick) is deposited, as shown in FIG. 29C. Etching though the photoresist film 41 as the mask is performed on the P—SiN film 37 and the metal multi-layer film 36 in order to form the word line 12, as shown in FIG. 29D. In this way it is possible to form the lower layer wiring 31 below the word line 12.

Figure 29E:
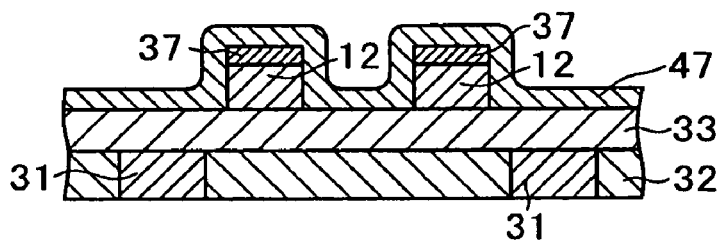
Figure 29F:
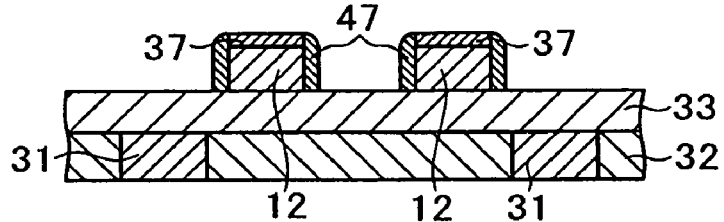

The P—SiN film 47 (50 nm thick) is deposited and etch-back is performed on it, as shown in FIG. 29E. This step forms the side wall 47 of P—SiN on the lateral surface of the word line 12, as shown in FIG. 29F. The amount of overetching should be set up so that the P—SiN film 37 remains more than 70 nm on the word line 12.

Figure 30A:
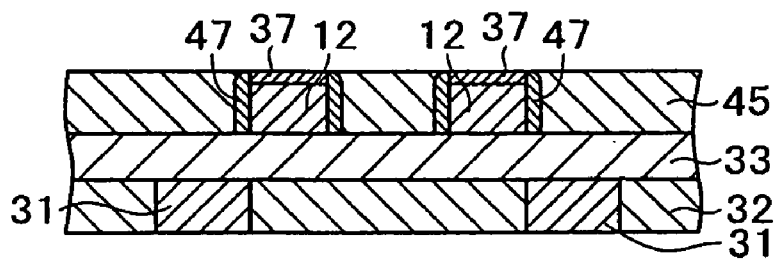
FIG. 30A to 30D is a diagram showing the process for production of MRAM according to Embodiment 4-2 of the present invention.

CVD or PVD is performed to deposit the insulating film 45 of $SiO_2$ or $Al_2O_3$ over the entire surface, and CMP is performed to planarize and polish the insulating film 45, so that P—SiN film 37 is exposed, as shown in FIG. 30A.

Figure 30B:
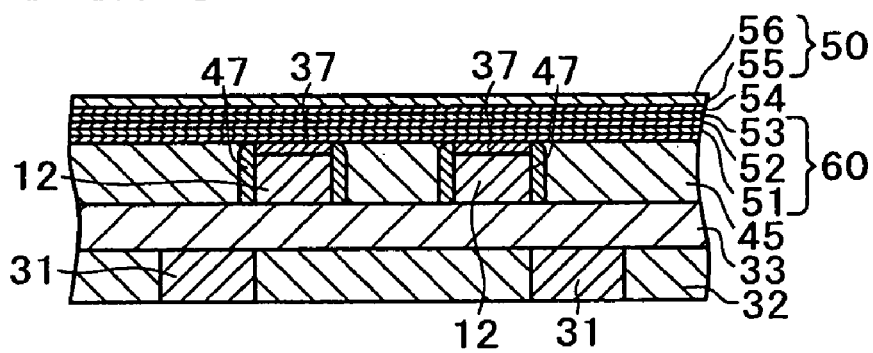

PVD is carried out to sequentially form the pinned layer 60 (consisting of the barrier layer 51, the antiferromagnetic layer 52, and the ferromagnetic layer 53) and the free layer 50 (consisting of the tunnel insulating film 54, the ferromagnetic layer (memory layer) 55, and the cap layer 56) from the same materials as used in Embodiment 1, as shown in FIG. 30B.

Figure 30C:
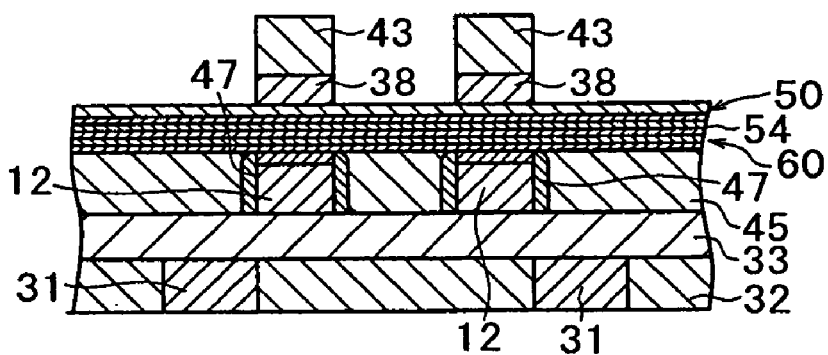

The P-TEOS film 38 (200 nm thick) is deposited and then it is patterned by reactive ion etching through the photoresist film 43 as the mask, as shown in FIG. 30C. This P-TEOS film 38 functions as the etch-selective film that covers the upper surface of the TMR element.

Figure 30D:
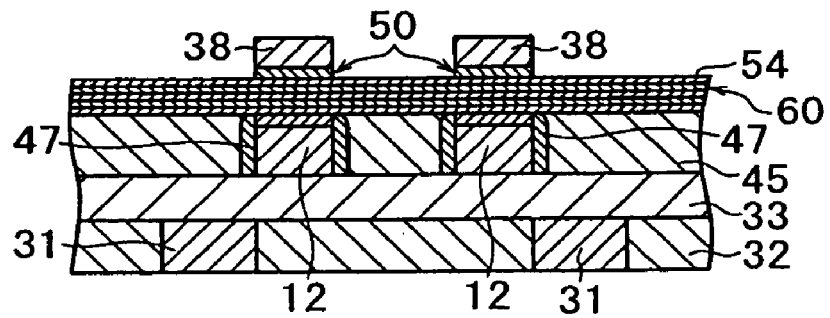

With the photoresist film removed, reactive ion etching is performed on the free layer 50 (consisting of the cap layer 56 and the upper ferromagnetic layer 55) through the P-TEOS film 38 as the mask, as shown in FIG. 30D. Etching should be carried out such that it terminates in the tunnel insulating film 54 after it has completely removed the upper ferromagnetic layer 55. In addition, etching should be carried out such that the P-TEOS film 38 remains more than 100 nm on the cap layer 56 and the memory layer 55. The etching gas is a halogen gas containing chlorine or a carbon monoxide gas mixed with $NH_3$.

Figure 31A:
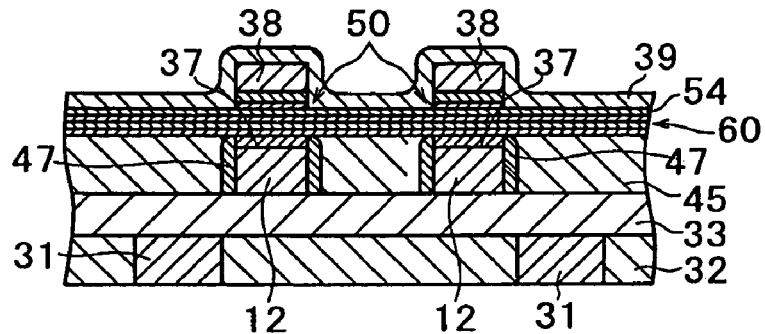
FIG. 31A to 31D is a diagram showing the process for production of MRAM according to Embodiment 4-2 of the present invention.
Figure 31B:
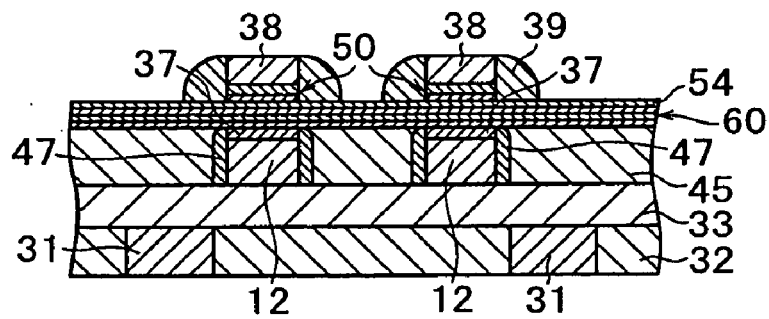

The P-TEOS film 39 (200 nm thick) is deposited over the entire upper surface, as shown in FIG. 31A. Etch-back is performed on it to form the side wall 39 (as the etching mask) on the lateral surface of the free layer 50, as shown in FIG. 31B.

Figure 31C:
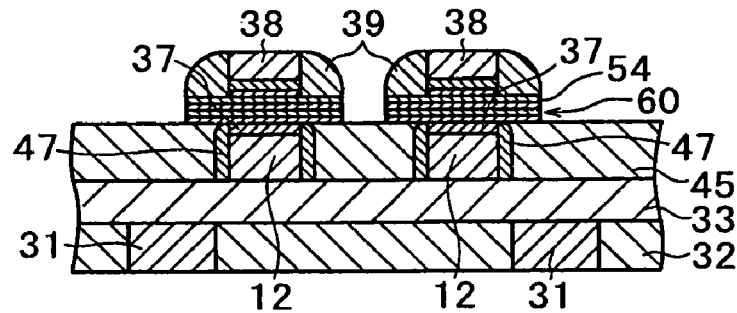

The tunnel insulating film 54 and the pinned layer 60 are removed by reactive ion etching that employs as the mask the upper P-TEOS film 38 covering the free layer 50 and the side wall 39 of P-TEOS, as shown in FIG. 31C. The etching gas is a halogen gas containing chlorine or a carbon monoxide gas mixed with $NH_3$.

Figure 31D:
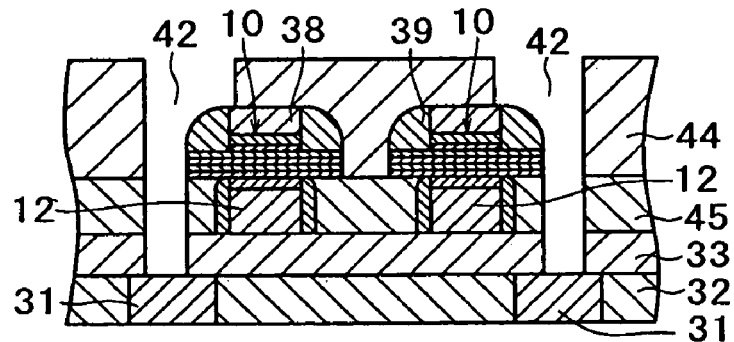

The photoresist mask 41 is formed and the connecting hole 42 reaching the lower layer wiring 31 is made, as shown in FIG. 31D. The photoresist mask 41 is formed such that the P-TEOS film 38 and the side wall 39 are partly exposed. The word line 12 existing below the TMR element 10 has its upper and lateral sides surrounded by an etch-selective material, and the insulating film 45 which has its top covered with the P-TEOS film 38 and the side wall 39 remains unetched when the connecting hole 42 is made. Consequently, the word line 12 is protected more safely and the connecting hole 42 is formed close to the word line 12 easily by full-wafer etching. Thus, it is possible to form the local wiring (mentioned later) along the wall surface of the connecting hole 42.

Figure 32A:
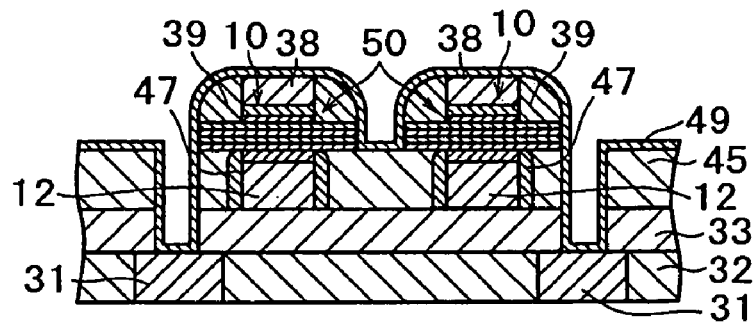
FIG. 32A to 32D is a diagram showing the process for production of MRAM according to Embodiment 4-2 of the present invention.
Figure 32B:
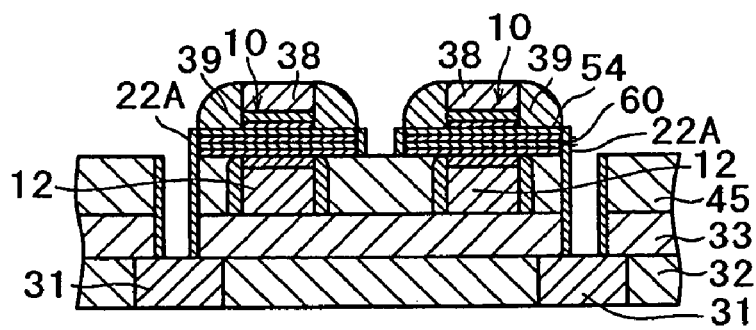

With the resist mask 41 removed, the Cu film 49 is formed, for example, by sputtering over the entire upper surface, as shown in FIG. 32A. Etch-back is performed on the Cu film 49 so as to remove the upper Cu film, as shown in FIG. 32B. The Cu film remains on the tunnel insulating film 54, the lateral surface of the pinned layer 60, and the side wall surface of the connecting hole 42. The local wiring 22A is formed from the Cu film which has remained, extending from the tunnel insulating film 54 and the one side of the pinned layer 60 to one of the side wall surfaces of the connecting hole 42. The distance between the word line 12 and the local wiring 22A can be reduced.

Figure 32C:
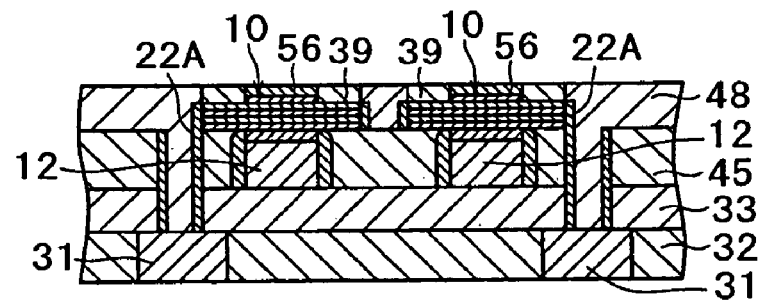

CVD or PVD is performed to deposit the insulating film 48 of $SiO_2$ or $Al_2O_3$ over the entire surface, and CMP is performed to planarize and polish the insulating film 48 and the P-TEOS film 38, so that the cap layer 56 (which is the uppermost layer of the TMR.) is exposed, as shown in FIG. 32C. The exposed part functions as a self-aligned contact for the bit line.

Figure 32D:
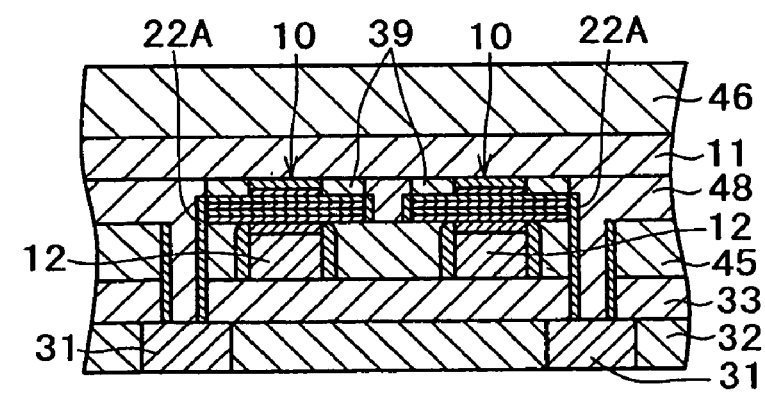
Figure 33:
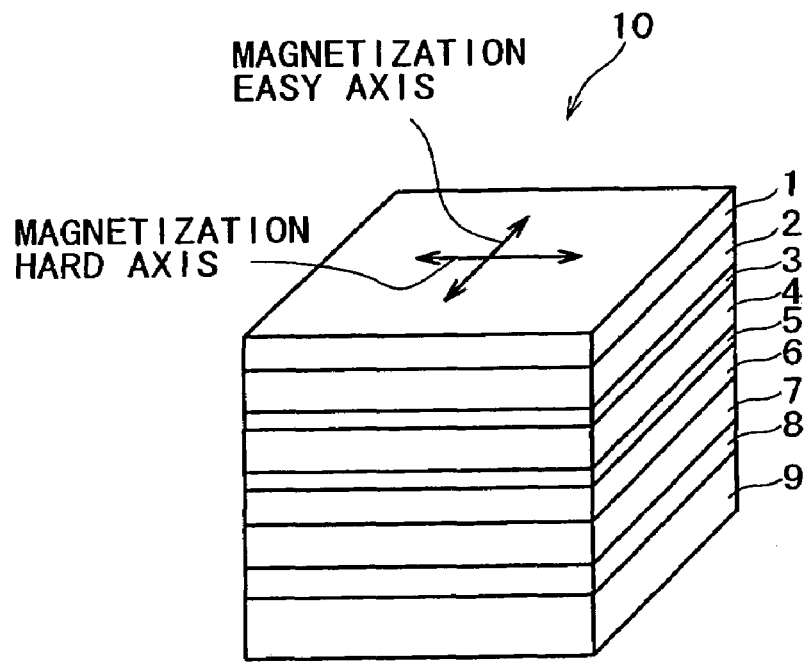
FIG. 33 is a schematic perspective view of the TMR element of the MRAM.
Figure 34:
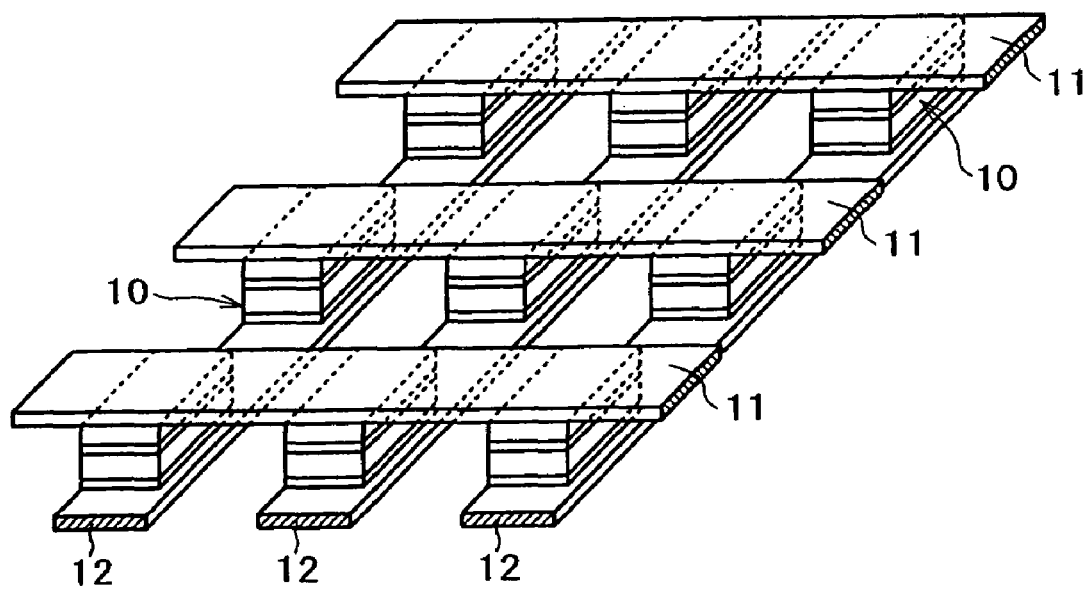
FIG. 34 is a partial schematic perspective of the memory cell of the MRAM.
Figure 35:
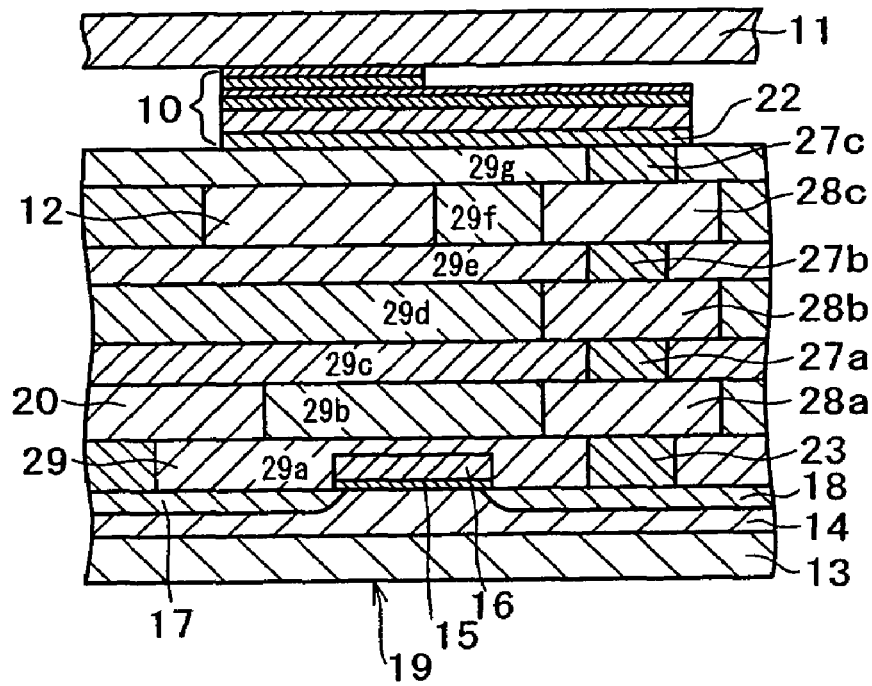
FIG. 35 is a schematic sectional view of the memory cell of the MRAM.
Figure 36:
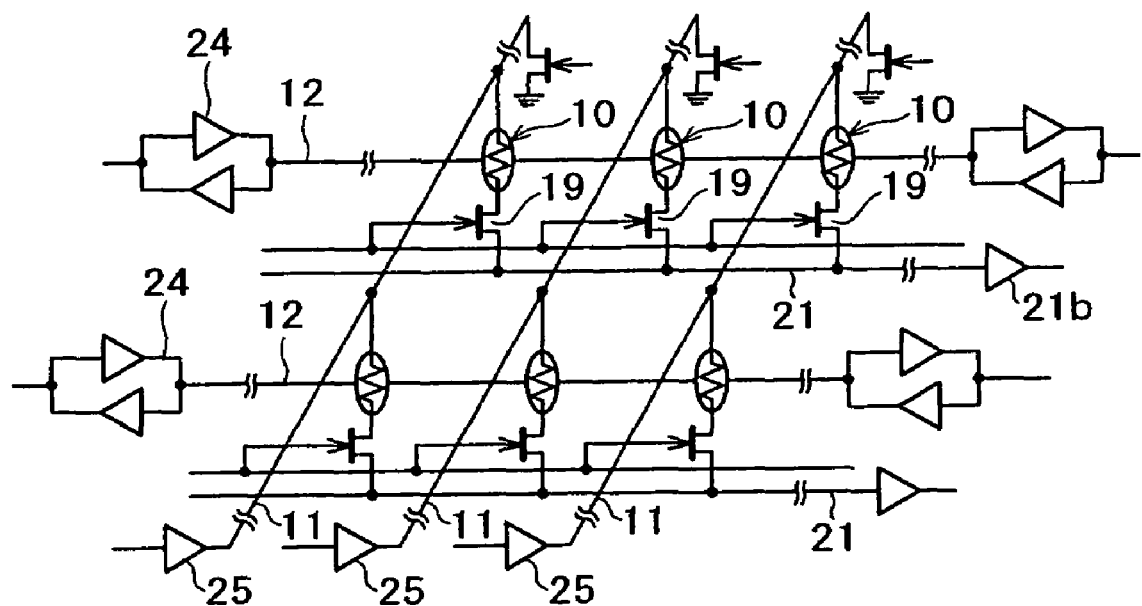
FIG. 36 is an equivalent circuit diagram of the MRAM.
Figure 37:
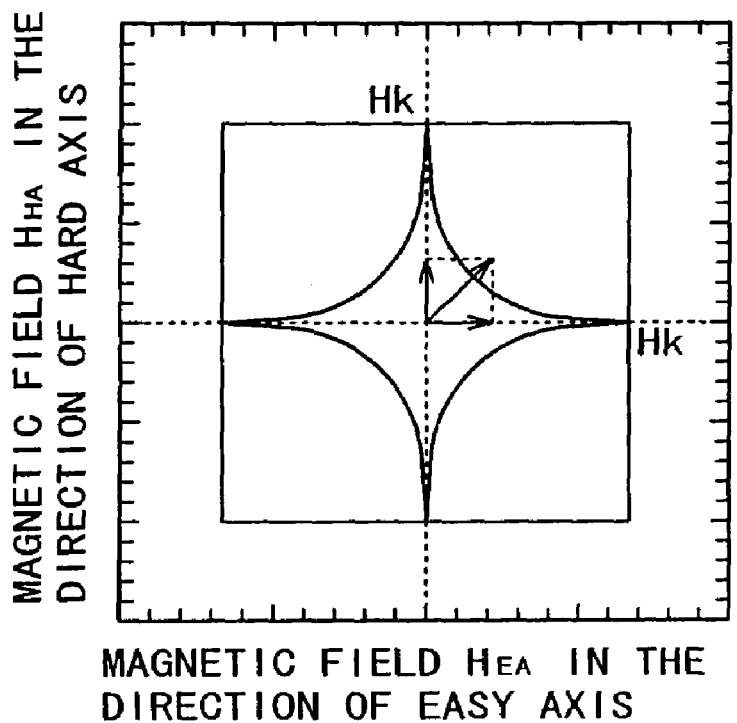
FIG. 37 is a characteristic diagram showing the magnetic response at the time of writing in the MRAM.
Figure 38:
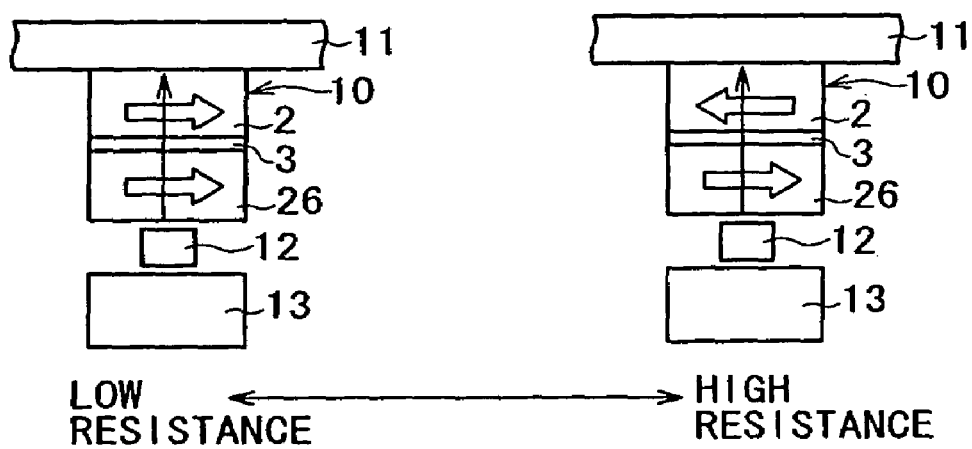
FIG. 38 is a diagram illustrating the principle for reading by the MRAM.

The bit line 11, the peripheral circuit wiring (not shown), and the bonding pad region (not shown) are formed by the standard wiring technology, as shown in FIG. 32D. The plasma silicon nitride film 46 is deposited over the entire surface. Finally, a hole for the bonding pad region is made. Thus, the wafer process for LSI is completed.

Embodiment 4 mentioned above offers the following advantages. The lower layer wiring 31 is formed below the word line 12. The upper surface 38 and the lateral surface 39 of the free layer 50 of the TMR element 10 are covered with a mask of etch-selective material. By using this mask and the resist mask 41 as the mask, the connecting hole 42 for connection to the plug 34 formed on the lower layer wiring 31 is formed (in Embodiment 4-1). Alternatively, not only the mask of the upper surface and lateral surface of the free layer 50 but also the upper surface and lateral surface of the word line 12 are surrounded by an etch-selective material. By using the free layer 50 and the resist mask as the mask, the connecting hole 42 reaching the lower layer wiring 31 is formed (in Embodiment 4-2). The reading wiring is formed with the local wiring 22A extending from the tunnel insulating film 54 and the lateral surface of the pinned layer 60 to the side wall surface of the connecting hole 42, and it is connected to the lower layer wiring 31 directly or through the plug 34.

However, since the upper surface and the lateral surface of the free layer 50 of the TMR element 10 are covered with an etch-selective mask, it is possible to surely protect the word line 12 existing below this mask when the connecting hole 42 is formed (in Embodiment 4-1), and in the case where the word line 12 itself is surrounded by an etch-selective material (in Embodiment 4-2), the word line 12 is protected more surely. Therefore, it is possible to easily form the connecting hole 42. In both cases, it is possible to reduce the distance between the connecting hole 42 and the word line 12. Since the region below the connecting hole 42 shown in FIG. 1B is reduced, the size in the direction along the bit line 11 is reduced as much as F and the conventional size 4F (shown in FIG. 39) can be reduced to 3F.

As the result, the MRAM region in the direction along the bit line can be reduced, by 1F, to 3F (4F−1F) as in Embodiment 1, and the memory cell size can be reduced to 9F2 (3F in the direction along the bit line×3F in the direction intersecting the bit line). This result should be compared with the MRAM of conventional structure in which the region in the direction along the bit line is 4F, as shown in FIG. 39.

The above-mentioned embodiments may be variously modified within the scope of the present invention.

For example, although the wiring pattern of the reading wiring 22 was formed from the other layer (or the pinned layer 60 consisting of the tunnel insulating film 54, the ferromagnetic film 53, the antiferromagnetic layer 52, and the barrier layer 51) than the free layer 50 (consisting of the cap layer 56 and the memory layer 55), it is possible to form it with the pinned layer 60 or the barrier layer 51 alone. In this way it is possible to place any other material than that used for the reading wiring 22 in the position necessary for formation of the TMR element. This saves materials and simplifies steps.

The plug 34 formed on the lower wiring 31 may be omitted, and all can be connected directly to the lower layer wiring 31 by extending the reading wiring 22.

The plug 34 may be formed by electroless plating as well as electrolytic plating (for damascene process). The Cu film 49 in Embodiment 3 may be formed by electrolytic plating (for damascene process) in place of electroless plating.

In Embodiments 3 and 4, an etch-selective material is placed on the upper and lateral surfaces of the TMR element 10, however, the material on the upper surface may be omitted. Even though this material is absent, the connecting hole 42 can be formed by covering the upper surface entirely with the resist mask.

The production process and materials used in each embodiment may be replaced by any adequate ones.

What is claimed is:

1. A magnetic memory device comprising:
    a plurality of tunnel magnetoresistance effect elements, each comprising at least a magnetization pinned layer in which the direction of magnetization is pinned, a tunnel barrier layer, and a magnetic layer in which the direction of magnetization is variable;
    a first conducting element formed on one side of each tunnel magnetoresistance effect element with a first insulating layer interposed therebetween; and
    a second conducting element formed on the other side of each tunnel magnetoresistance effect element,
    wherein information is written into each tunnel magnetoresistance effect element by applying current to the first conducting element and also to the second conducting element, and written information is read out of each tunnel magnetoresistance effect element through a read wiring having a connection to a secondary wiring,
    wherein the read wiring is comprised of a contiguous conductive material formed during a different process than a process during which the first and second conducting elements are formed, and
    wherein said secondary wiring is separated from said tunnel magnetoresistance effect element by at least a layer containing said first conductive element or said second conductive element.

2. The magnetic memory device as defined in claim 1, wherein the read wiring is connected to a conducting plug and said conducting plug is further connected to the secondary wiring.

3. The magnetic memory device as defined in claim 1, wherein the read wiring is connected to the secondary wiring by a local wiring.

4. The magnetic memory device as defined in claim 3, wherein the read wiring is connected to the secondary wiring through a first connecting hole and a second connecting hole.

5. The magnetic memory device as defined in claim 2, wherein at least a portion of the conducting plug is formed at a same height as the first insulating layer.

6. The magnetic memory device as defined in claim 2, wherein the conducting plug is formed at a height which is lower than the first insulating layer.

7. The magnetic memory device as defined in claim 1, wherein at least a lateral surface of a layer containing the first conducting element is covered with a material that is etch-selective for an etchant other than an etchant used to form the first conducting element.

8. The magnetic memory device as defined in claim 1, wherein an upper constituent layer above the magnetization pinned layer of the tunnel magnetoresistance effect element is patterned and at least a lateral surface of the pattern is covered with a material which is etch-selective for a constituent layer below the upper constituent layer and a layer in which at least the first conducting element is embedded.

9. The magnetic memory device as defined in claim 1, which is constructed such that a second insulating layer is held between the magnetization pinned layer and the magnetic layer, and information is written by applying a current to a bit line and a word line formed above and below the tunnel magnetoresistance effect element so that the current induces a magnetic field which magnetizes the magnetic layer in a prescribed direction, and written information is read by the tunnel magnetoresistance effect through the second insulating layer as the tunnel barrier layer.

10. A method for producing a magnetic memory device having a plurality of tunnel magnetoresistance effect elements, each comprising at least a magnetization pinned layer in which the direction of magnetization is pinned, a tunnel barrier layer, and a magnetic layer in which the direction of magnetization is variable, such that information is written into the tunnel magnetoresistance effect element as current is applied to a first conducting element formed on one side of the tunnel magnetoresistance effect element with a first insulating layer interposed therebetween and a second conducting element formed on the other side of the tunnel magnetoresistance effect element,
> wherein written information is read out of the tunnel magnetoresistance effect element through a read wiring of the tunnel magnetoresistance effect element which connects to a secondary wiring wherein the read wiring is comprised of a contiguous conductive material formed during a different process than a process during which the first and second conducting elements are formed, and
> wherein said secondary wiring is separated from said tunnel magnetoresistance effect element by at least a layer containing said first conductive element or said second conductive element,
> the method comprising:
> embedding a secondary wiring to be connected to the read wiring in a second insulating layer, wherein the layer containing the secondary wiring is formed so as to be separated from the tunnel magnetoresistance effect element by at least said layer containing said first conductive element or said layer containing said second conductive element;
> forming a connecting hole in the layer containing the first conducting element at a position offset from the first conducting element embedded therein; and
> connecting the read wiring through the connecting hole to the secondary wiring.

11. The method for producing a magnetic memory device as defined in claim 10, wherein the read wiring is connected a conducting plug and said conducting plug is further connected to the secondary wiring.

12. The method for producing a magnetic memory device as defined in claim 10, wherein the read wiring is connected to the secondary wiring by a local wiring which covers a lateral side-surface of the tunnel magnetoresistance effect element and extends down a wall surface of the connecting hole to the secondary wiring.

13. The method for producing a magnetic memory device as defined in claim 11, wherein the read wiring is connected through the connecting hole to the secondary wiring.

14. The method for producing a magnetic memory device as defined in claim 11, wherein at least a portion of the conducting plug is formed a same height as the first insulating layer.

15. The method for producing a magnetic memory device as defined in claim 11, wherein the conducting plug is formed at a height which is lower than the first insulating layer.

16. The method for producing a magnetic memory device as defined in claim 10, wherein at least a lateral surface of a layer containing the first conducting element is covered with a material which is etch-selective for a material other than the material used to form the first conducting element, and the connecting hole is formed by selectively etching at least the material present in the layer containing the first conducting element other than the material used to form the first conducting element by using the coating material as the mask.

17. The method for producing a magnetic memory device as defined in claim 10, wherein an upper constituent layer above the magnetization pinned layer of the tunnel magnetoresistance effect element is patterned and at least a lateral surface of the pattern is covered with a material which is etch-selective for at least the constituent layer below the upper constituent layer and a layer containing the first conducting element, and the second connecting hole is formed by selectively etching the at least lower constituent layer and the layer containing a first conducting element by using the coating material as a mask.

18. The method for producing a magnetic memory device as defined in claim 10, wherein the magnetic memory device is constructed such that an insulating layer is held between the magnetization pinned layer and the magnetic layer, and information is written by applying a current to a bit line and a word line formed above and below the tunnel magnetoresistance effect element so that the current induces a magnetic field which magnetizes the magnetic layer in a prescribed direction, and written information is read by the tunnel magnetoresistance effect through the insulating layer as the tunnel barrier layer.

* * * * *